(12) United States Patent
Oh et al.

(10) Patent No.: US 11,240,602 B2
(45) Date of Patent: Feb. 1, 2022

(54) SOUND QUALITY IMPROVEMENT BASED ON ARTIFICIAL INTELLIGENCE

(71) Applicant: LG ELECTRONICS INC., Seoul (KR)

(72) Inventors: Sangjun Oh, Seoul (KR); Senghyun Huang, Seoul (KR); Youngman Kim, Seoul (KR); Kyuho Lee, Seoul (KR); Jaewoong Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/031,565

(22) Filed: Sep. 24, 2020

(65) Prior Publication Data

US 2021/0306746 A1   Sep. 30, 2021

(30) Foreign Application Priority Data

Mar. 30, 2020 (KR) ................. 10-2020-0038168

(51) Int. Cl.
*H04R 3/04* (2006.01)
*G10L 25/51* (2013.01)
*G06N 3/08* (2006.01)
*H04L 29/06* (2006.01)

(52) U.S. Cl.
CPC .............. *H04R 3/04* (2013.01); *G06N 3/084* (2013.01); *G10L 25/51* (2013.01); *H04L 65/60* (2013.01); *H04R 2430/01* (2013.01); *H04R 2499/11* (2013.01)

(58) Field of Classification Search
None
See application file for complete search history.

(56) References Cited

U.S. PATENT DOCUMENTS

| | | | |
|---|---|---|---|
| 8,639,516 B2* | 1/2014 | Lindahl | G10L 21/0208 704/275 |
| 9,031,838 B1* | 5/2015 | Nash | H04M 3/2227 704/231 |
| 2009/0180608 A1* | 7/2009 | Kee | H04M 1/60 379/394 |
| 2019/0018644 A1* | 1/2019 | Kovacevic | G06Q 50/01 |
| 2019/0196777 A1* | 6/2019 | Kovacevic | G06F 16/65 |
| 2020/0174734 A1* | 6/2020 | Gomes | G06F 3/165 |
| 2020/0241834 A1* | 7/2020 | Boeen | G10L 25/51 |
| 2021/0118461 A1* | 4/2021 | Boeen | G10L 15/22 |

* cited by examiner

*Primary Examiner* — Paul W Huber
(74) *Attorney, Agent, or Firm* — Lee Hong Degerman Kang & Waimey

(57) ABSTRACT

A sound quality improvement based on artificial intelligence is disclosed. A sound control method based on artificial intelligence according to an embodiment of the present disclosure provides a different call sound quality for each person based on a plurality of person information stored in an address book of a mobile terminal. The mobile terminal and 5G network of the present disclosure may be associated with an artificial intelligence module, a drone ((Unmanned Aerial Vehicle, UAV), a robot, an AR (Augmented Reality) device, a VR (Virtual Reality) device, a device associated with 5G services, etc.

20 Claims, 14 Drawing Sheets

FIG. 15

| Cluster | Person | Terminal type | Voice characteristics | Call sound quality |
|---------|--------|---------------|----------------------|--------------------|
| A | John | LG V50 ThinQ | Low voice : Level 3/5<br>Loud sound | Low voice: Level 2/5<br>Normal sound |
| A | Smith | Galaxy S10 | Low voice: Level 5/5<br>Small sound | Low voice: Level 2/5<br>Normal sound |
| B | Jane | iPhone 10 | High voice: Level 5/5<br>Loud sound | High voice: Level 2/5<br>Normal sound |
| C | Coco | Xiaomi Redmi Note 5 | Xiaomi Redmi Note 5<br>Small sound | High voice: Level 3/5<br>Normal sound |

SOUND QUALITY IMPROVEMENT BASED ON ARTIFICIAL INTELLIGENCE

CROSS-REFERENCE TO RELATED APPLICATION

Pursuant to 35 U.S.C. § 119(a), this application claims the benefit of earlier filing date and right of priority to Korean Patent Application No. 10-2020-0038168, filed on Mar. 30, 2020, the contents of which are hereby incorporated by reference herein in its entirety.

BACKGROUND OF THE INVENTION

Field of the Invention

The present disclosure relates to sound quality improvement based on artificial intelligence.

Description of the Related Art

Artificial intelligence technologies are composed of machine learning (deep learning) and element technologies utilizing the machine learning.

The machine learning is an algorithm technology that classifies/learns features of input data by itself. The element technology is a technology that simulates functions such as cognition and judgment of the human brain by utilizing machine learning algorithms such as the deep learning, and is composed of technical fields such as linguistic understanding, visual understanding, inference/prediction, knowledge expression, and motion control.

On the other hand, artificial intelligence technology can also be applied to a call service through a mobile terminal. In the call service provided conventionally, the call sound quality of the mobile terminal is limited in that the call sound quality cannot be personalized according to the sound feature of the user or the far-end, and is constantly output.

SUMMARY OF THE INVENTION

The present disclosure is intended to solve address the above-described needs and/or problems.

In addition, an object of the present disclosure is to implement sound quality improvement based on artificial intelligence that can personalize the call sound quality of the mobile terminal according to the feature of the user or the far-end.

In addition, an object of the present disclosure is to implement sound quality improvement based on artificial intelligence that can learn the feature of the call voice of the far-end for each user information recorded in the address book.

A sound control method according to an embodiment of the present disclosure includes generating at least one set of person information including at least one person information based on an attribute of a sound signal; and performing a task of adjusting a parameter of an audio equalizer based on information representing the set of person information and a feature vector of the sound signal using a machine learning model.

In addition, the method may further include receiving the sound signal while performing a wireless call with a mobile terminal connected to communication; and storing the received sound signal in a memory, wherein the sound signal may include a voice signal obtained through a microphone of the mobile terminal connected to communication.

In addition, the attribute may include a volume for each of a plurality of frequency bands.

In addition, the generating the set of person information may include calculating a similarity by comparing attributes of two or more persons for each frequency band; classifying the two or more person information based on the similarity; and generating the set of person information including the classified two or more person information.

In addition, the plurality of frequency bands may include first to Nth bands (N is a natural number), and a frequency bandwidth of Kth band (K is a natural number of 2 or more, K<N) may be an integer multiple of a frequency bandwidth of K-1th band.

In addition, when the parameter of the audio equalizer changes from a first state to a second state, reinforcement learning that adjusts a parameter of the machine learning model may be performed based on a difference between the first and second states.

In addition, a parameter of the machine learning model may be adjusted in response to receiving feedback on a result of performing the task.

In addition, the feedback may be an input for adjusting the parameter of the audio equalizer through a user interface.

In addition, the parameter of the audio equalizer may be mapped to the person information and stored in a memory.

In addition, the method may further include, when receiving a call signal from a user corresponding to the person information stored in the memory, loading the parameter of the audio equalizer stored in the memory in response to the call signal; and controlling a call sound quality output through a speaker based on the loaded parameter of the audio equalizer.

An intelligent mobile terminal according to another embodiment of the present disclosure includes a transceiver configured to receive a sound signal through a network; a memory in which at least one person information is recorded; and a processor configured to generate at least one set of person information including the at least one person information based on an attribute of the sound signal; and perform a task of adjusting a parameter of an audio equalizer based on information representing the set of person information and a feature vector of the sound signal using a machine learning model.

Effects of the sound quality improvement based on artificial intelligence according to an embodiment of the present disclosure will be described as follows.

The present disclosure can personalize the call sound quality of the mobile terminal according to the feature of the user or the far-end.

In addition, the present disclosure can learn the feature of the call voice of the far-end for each user information recorded in the address book.

The effects obtained in the present disclosure are not limited to the above-mentioned effects, and other effects not mentioned will be clearly understood by those skilled in the art from the following description.

BRIEF DESCRIPTION OF THE DRAWINGS

A more complete appreciation of the disclosure and many of the attendant aspects thereof will be readily obtained as the same becomes better understood by reference to the following detailed description when considered in connection with the accompanying drawings, wherein:

FIGS. 14 and 15 are views for explaining an implementation example of a sound control method according to an embodiment of the present disclosure.

DETAILED DESCRIPTION OF THE EMBODIMENTS

Hereinafter, embodiments of the disclosure will be described in detail with reference to the attached drawings. The same or similar components are given the same reference numbers and redundant description thereof is omitted. The suffixes "module" and "unit" of elements herein are used for convenience of description and thus can be used interchangeably and do not have any distinguishable meanings or functions. Further, in the following description, if a detailed description of known techniques associated with the present invention would unnecessarily obscure the gist of the present invention, detailed description thereof will be omitted. In addition, the attached drawings are provided for easy understanding of embodiments of the disclosure and do not limit technical spirits of the disclosure, and the embodiments should be construed as including all modifications, equivalents, and alternatives falling within the spirit and scope of the embodiments.

While terms, such as "first", "second", etc., may be used to describe various components, such components must not be limited by the above terms. The above terms are used only to distinguish one component from another.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements.

The singular forms are intended to include the plural forms as well, unless the context clearly indicates otherwise.

In addition, in the specification, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Hereinafter, 5G communication (5th generation mobile communication) required by an apparatus requiring AI processed information and/or an AI processor will be described through paragraphs A through G.

A. Example of Block Diagram of UE and 5G Network

Figure 1:
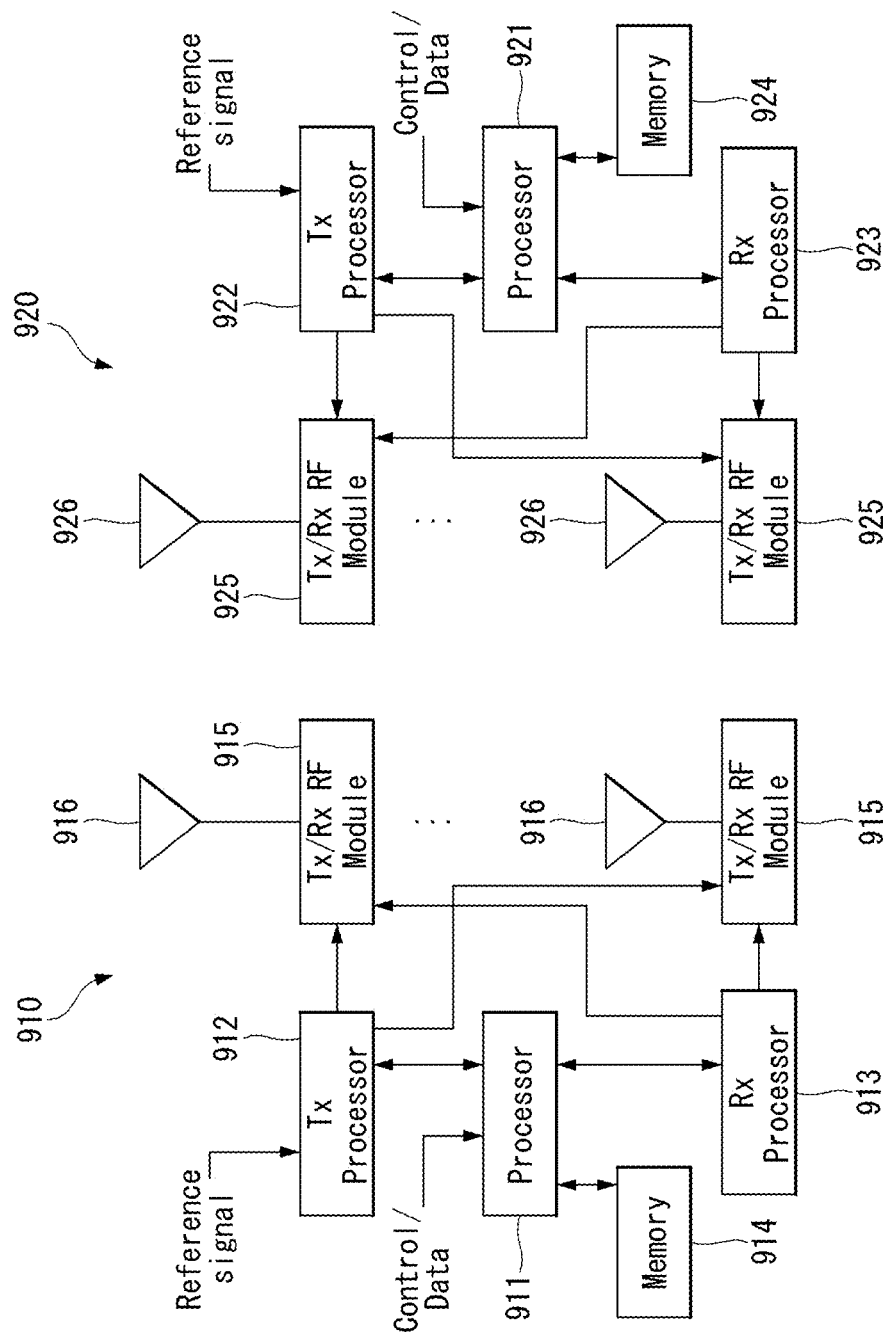
FIG. 1 is a block diagram of a wireless communication system to which methods proposed in the disclosure are applicable.

FIG. 1 is a block diagram of a wireless communication system to which methods proposed in the disclosure are applicable.

Referring to FIG. 1, a device (AI device) including an AI module is defined as a first communication device (910 of FIG. 1), and a processor 911 can perform detailed AI operation.

A 5G network including another device(AI server) communicating with the AI device is defined as a second communication device (920 of FIG. 1), and a processor 921 can perform detailed AI operations.

The 5G network may be represented as the first communication device and the AI device may be represented as the second communication device.

For example, the first communication device or the second communication device may be a base station, a network node, a transmission terminal, a reception terminal, a wireless device, a wireless communication device, an autonomous device, or the like.

For example, the first communication device or the second communication device may be a base station, a network node, a transmission terminal, a reception terminal, a wireless device, a wireless communication device, a vehicle, a vehicle having an autonomous function, a connected car, a drone (Unmanned Aerial Vehicle, UAV), and AI (Artificial Intelligence) module, a robot, an AR (Augmented Reality) device, a VR (Virtual Reality) device, an MR (Mixed Reality) device, a hologram device, a public safety device, an MTC device, an IoT device, a medical device, a Fin Tech device (or financial device), a security device, a climate/environment device, a device associated with 5G services, or other devices associated with the fourth industrial revolution field.

For example, a terminal or user equipment (UE) may include a cellular phone, a smart phone, a laptop computer, a digital broadcast terminal, personal digital assistants (PDAs), a portable multimedia player (PMP), a navigation device, a slate PC, a tablet PC, an ultrabook, a wearable device (e.g., a smartwatch, a smart glass and a head mounted display (HMD)), etc. For example, the HMD may be a display device worn on the head of a user. For example, the HMD may be used to realize VR, AR or MR. For example, the drone may be a flying object that flies by wireless control signals without a person therein. For example, the VR device may include a device that implements objects or backgrounds of a virtual world. For example, the AR device may include a device that connects and implements objects or background of a virtual world to objects, backgrounds, or the like of a real world. For example, the MR device may include a device that unites and implements objects or background of a virtual world to objects, backgrounds, or the like of a real world. For example, the hologram device may include a device that implements 360-degree 3D images by recording and playing 3D information using the interference phenomenon of light that is generated by two lasers meeting each other which is called holography. For example, the public safety device may include an image repeater or an imaging device that can be worn on the body of a user. For example, the MTC device and the IoT device may be devices that do not require direct interference or operation by a person. For example, the MTC device and the IoT device may include a smart meter, a bending machine, a thermometer, a smart bulb, a door lock, various sensors, or the like. For example, the medical device may be a device that is used to diagnose, treat, attenuate, remove, or prevent diseases. For example, the medical device may be a device that is used to diagnose, treat, attenuate, or correct injuries or disorders. For example, the medial device may be a device that is used to examine, replace, or change structures or functions. For example, the medical device may be a device that is used to control pregnancy. For example, the medical device may include a device for medical treatment, a device for operations, a device for (external) diagnose, a hearing aid, an operation device, or the like. For example, the security device may be a device that is installed to prevent a danger that is likely to occur and to keep safety. For example, the security device may be a camera, a CCTV, a recorder, a black box, or the like. For example, the Fin Tech device may be a device that can provide financial services such as mobile payment.

Referring to FIG. 1, the first communication device 910 and the second communication device 920 include processors 911 and 921, memories 914 and 924, one or more Tx/Rx radio frequency (RF) modules 915 and 925, Tx processors 912 and 922, Rx processors 913 and 923, and antennas 916 and 926. The Tx/Rx module is also referred to as a transceiver. Each Tx/Rx module 915 transmits a signal through each antenna 926. The processor implements the aforementioned functions, processes and/or methods. The processor 921 may be related to the memory 924 that stores program code and data. The memory may be referred to as a computer-readable medium. More specifically, the Tx processor 912 implements various signal processing functions with respect to L1 (i.e., physical layer) in DL (communication from the first communication device to the second communication device). The Rx processor implements various signal processing functions of L1 (i.e., physical layer).

UL (communication from the second communication device to the first communication device) is processed in the first communication device 910 in a way similar to that described in association with a receiver function in the second communication device 920. Each Tx/Rx module 925 receives a signal through each antenna 926. Each Tx/Rx module provides RF carriers and information to the Rx processor 923. The processor 921 may be related to the memory 924 that stores program code and data. The memory may be referred to as a computer-readable medium.

B. Signal Transmission/Reception Method in Wireless Communication System

Figure 2:
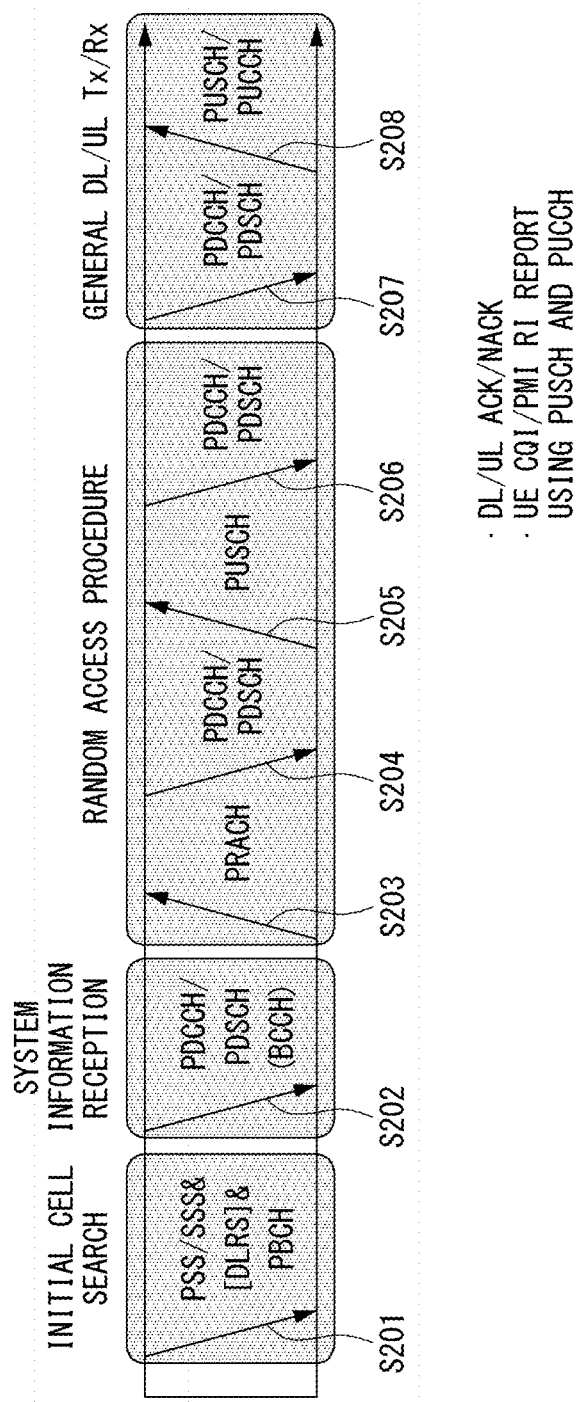
FIG. 2 is a diagram showing an example of a signal transmission/reception method in a wireless communication system.

FIG. 2 is a diagram showing an example of a signal transmission/reception method in a wireless communication system.

Referring to FIG. 2, when a UE is powered on or enters a new cell, the UE performs an initial cell search operation such as synchronization with a BS (S201). For this operation, the UE can receive a primary synchronization channel (P-SCH) and a secondary synchronization channel (S-SCH) from the BS to synchronize with the BS and acquire information such as a cell ID. In LTE and NR systems, the P-SCH and S-SCH are respectively called a primary synchronization signal (PSS) and a secondary synchronization signal (SSS). After initial cell search, the UE can acquire broadcast information in the cell by receiving a physical broadcast channel (PBCH) from the BS. Further, the UE can receive a downlink reference signal (DL RS) in the initial cell search step to check a downlink channel state. After initial cell search, the UE can acquire more detailed system information by receiving a physical downlink shared channel (PDSCH) according to a physical downlink control channel (PDCCH) and information included in the PDCCH (S202).

Meanwhile, when the UE initially accesses the BS or has no radio resource for signal transmission, the UE can perform a random access procedure (RACH) for the BS (steps S203 to S206). To this end, the UE can transmit a specific sequence as a preamble through a physical random access channel (PRACH) (S203 and S205) and receive a random access response (RAR) message for the preamble through a PDCCH and a corresponding PDSCH (S204 and S206). In the case of a contention-based RACH, a contention resolution procedure may be additionally performed.

After the UE performs the above-described process, the UE can perform PDCCH/PDSCH reception (S207) and physical uplink shared channel (PUSCH)/physical uplink control channel (PUCCH) transmission (S208) as normal uplink/downlink signal transmission processes. Particularly, the UE receives downlink control information (DCI) through the PDCCH. The UE monitors a set of PDCCH candidates in monitoring occasions set for one or more control element sets (CORESET) on a serving cell according to corresponding search space configurations. A set of PDCCH candidates to be monitored by the UE is defined in terms of search space sets, and a search space set may be a common search space set or a UE-specific search space set. CORESET includes a set of (physical) resource blocks having a duration of one to three OFDM symbols. A network can configure the UE such that the UE has a plurality of CORESETs. The UE monitors PDCCH candidates in one or more search space sets. Here, monitoring means attempting decoding of PDCCH candidate(s) in a search space. When the UE has successfully decoded one of PDCCH candidates in a search space, the UE determines that a PDCCH has been detected from the PDCCH candidate and performs PDSCH reception or PUSCH transmission on the basis of DCI in the detected PDCCH. The PDCCH can be used to schedule DL transmissions over a PDSCH and UL transmissions over a PUSCH. Here, the DCI in the PDCCH includes downlink assignment (i.e., downlink grant (DL grant)) related to a physical downlink shared channel and including at least a modulation and coding format and resource allocation information, or an uplink grant (UL grant) related to a physical uplink shared channel and including a modulation and coding format and resource allocation information.

An initial access (IA) procedure in a 5G communication system will be additionally described with reference to FIG. 2.

The UE can perform cell search, system information acquisition, beam alignment for initial access, and DL measurement on the basis of an SSB. The SSB is interchangeably used with a synchronization signal/physical broadcast channel (SS/PBCH) block.

The SSB includes a PSS, an SSS and a PBCH. The SSB is configured in four consecutive OFDM symbols, and a PSS, a PBCH, an SSS/PBCH or a PBCH is transmitted for each OFDM symbol. Each of the PSS and the SSS includes one OFDM symbol and 127 subcarriers, and the PBCH includes 3 OFDM symbols and 576 subcarriers.

Cell search refers to a process in which a UE acquires time/frequency synchronization of a cell and detects a cell identifier (ID) (e.g., physical layer cell ID (PCI)) of the cell. The PSS is used to detect a cell ID in a cell ID group and the SSS is used to detect a cell ID group. The PBCH is used to detect an SSB (time) index and a half-frame.

There are 336 cell ID groups and there are 3 cell IDs per cell ID group. A total of 1008 cell IDs are present. Information on a cell ID group to which a cell ID of a cell belongs is provided/acquired through an SSS of the cell, and information on the cell ID among 336 cell ID groups is provided/acquired through a PSS.

The SSB is periodically transmitted in accordance with SSB periodicity. A default SSB periodicity assumed by a UE during initial cell search is defined as 20 ms. After cell access, the SSB periodicity can be set to one of {5 ms, 10 ms, 20 ms, 40 ms, 80 ms, 160 ms} by a network (e.g., a BS).

Next, acquisition of system information (SI) will be described.

SI is divided into a master information block (MIB) and a plurality of system information blocks (SIBs). SI other than the MIB may be referred to as remaining minimum system information. The MIB includes information/parameter for monitoring a PDCCH that schedules a PDSCH carrying SIB1 (SystemInformationBlock1) and is transmitted by a BS through a PBCH of an SSB. SIB1 includes information related to availability and scheduling (e.g., transmission periodicity and SI-window size) of the remaining SIBs (hereinafter, SIBx, x is an integer equal to or greater than 2). SiBx is included in an SI message and transmitted over a PDSCH. Each SI message is transmitted within a periodically generated time window (i.e., SI-window).

A random access (RA) procedure in a 5G communication system will be additionally described with reference to FIG. 2.

A random access procedure is used for various purposes. For example, the random access procedure can be used for network initial access, handover, and UE-triggered UL data transmission. A UE can acquire UL synchronization and UL transmission resources through the random access procedure. The random access procedure is classified into a contention-based random access procedure and a contention-free random access procedure. A detailed procedure for the contention-based random access procedure is as follows.

A UE can transmit a random access preamble through a PRACH as Msg1 of a random access procedure in UL. Random access preamble sequences having different two lengths are supported. A long sequence length 839 is applied to subcarrier spacings of 1.25 kHz and 5 kHz and a short sequence length 139 is applied to subcarrier spacings of 15 kHz, 30 kHz, 60 kHz and 120 kHz.

When a BS receives the random access preamble from the UE, the BS transmits a random access response (RAR) message (Msg2) to the UE. A PDCCH that schedules a PDSCH carrying a RAR is CRC masked by a random access (RA) radio network temporary identifier (RNTI) (RA-RNTI) and transmitted. Upon detection of the PDCCH masked by the RA-RNTI, the UE can receive a RAR from the PDSCH scheduled by DCI carried by the PDCCH. The UE checks whether the RAR includes random access response information with respect to the preamble transmitted by the UE, that is, Msg1. Presence or absence of random access information with respect to Msg1 transmitted by the UE can be determined according to presence or absence of a random access preamble ID with respect to the preamble transmitted by the UE. If there is no response to Msg1, the UE can retransmit the RACH preamble less than a predetermined number of times while performing power ramping. The UE calculates PRACH transmission power for preamble retransmission on the basis of most recent pathloss and a power ramping counter.

The UE can perform UL transmission through Msg3 of the random access procedure over a physical uplink shared channel on the basis of the random access response information. Msg3 can include an RRC connection request and a UE ID. The network can transmit Msg4 as a response to Msg3, and Msg4 can be handled as a contention resolution message on DL. The UE can enter an RRC connected state by receiving Msg4.

C. Beam Management (BM) Procedure of 5G Communication System

A BM procedure can be divided into (1) a DL MB procedure using an SSB or a CSI-RS and (2) a UL BM procedure using a sounding reference signal (SRS). In addition, each BM procedure can include Tx beam swiping for determining a Tx beam and Rx beam swiping for determining an Rx beam.

The DL BM procedure using an SSB will be described.

Configuration of a beam report using an SSB is performed when channel state information (CSI)/beam is configured in RRC_CONNECTED.

A UE receives a CSI-ResourceConfig IE including CSI-SSB-ResourceSetList for SSB resources used for BM from a BS. The RRC parameter "csi-SSB-Resource-SetList" represents a list of SSB resources used for beam management and report in one resource set. Here, an SSB resource set can be set as {SSBx1, SSBx2, SSBx3, SSBx4, ... }. An SSB index can be defined in the range of 0 to 63.

The UE receives the signals on SSB resources from the BS on the basis of the CSI-SSB-ResourceSetList.

When CSI-RS reportConfig with respect to a report on SSBRI and reference signal received power (RSRP) is set, the UE reports the best SSBRI and RSRP corresponding thereto to the BS. For example, when reportQuantity of the CSI-RS reportConfig IE is set to 'ssb-Index-RSRP', the UE reports the best SSBRI and RSRP corresponding thereto to the BS.

When a CSI-RS resource is configured in the same OFDM symbols as an SSB and 'QCL-TypeD' is applicable, the UE can assume that the CSI-RS and the SSB are quasi co-located (QCL) from the viewpoint of 'QCL-TypeD'. Here, QCL-TypeD may mean that antenna ports are quasi co-located from the viewpoint of a spatial Rx parameter. When the UE receives signals of a plurality of DL antenna ports in a QCL-TypeD relationship, the same Rx beam can be applied.

Next, a DL BM procedure using a CSI-RS will be described.

An Rx beam determination (or refinement) procedure of a UE and a Tx beam swiping procedure of a BS using a CSI-RS will be sequentially described. A repetition parameter is set to 'ON' in the Rx beam determination procedure of a UE and set to 'OFF' in the Tx beam swiping procedure of a BS.

First, the Rx beam determination procedure of a UE will be described.

The UE receives an NZP CSI-RS resource set IE including an RRC parameter with respect to 'repetition' from a BS through RRC signaling. Here, the RRC parameter 'repetition' is set to 'ON'.

The UE repeatedly receives signals on resources in a CSI-RS resource set in which the RRC parameter 'repetition' is set to 'ON' in different OFDM symbols through the same Tx beam (or DL spatial domain transmission filters) of the BS.

The UE determines an RX beam thereof.

The UE skips a CSI report. That is, the UE can skip a CSI report when the RRC parameter 'repetition' is set to 'ON'.

Next, the Tx beam determination procedure of a BS will be described.

A UE receives an NZP CSI-RS resource set IE including an RRC parameter with respect to 'repetition' from the BS through RRC signaling. Here, the RRC parameter 'repetition' is related to the Tx beam swiping procedure of the BS when set to 'OFF'.

The UE receives signals on resources in a CSI-RS resource set in which the RRC parameter 'repetition' is set to 'OFF' in different DL spatial domain transmission filters of the BS.

The UE selects (or determines) a best beam.

The UE reports an ID (e.g., CRI) of the selected beam and related quality information (e.g., RSRP) to the BS. That is, when a CSI-RS is transmitted for BM, the UE reports a CRI and RSRP with respect thereto to the BS.

Next, the UL BM procedure using an SRS will be described.

A UE receives RRC signaling (e.g., SRS-Config IE) including a (RRC parameter) purpose parameter set to 'beam management" from a BS. The SRS-Config IE is used to set SRS transmission. The SRS-Config IE includes a list of SRS-Resources and a list of SRS-ResourceSets. Each SRS resource set refers to a set of SRS-resources.

The UE determines Tx beamforming for SRS resources to be transmitted on the basis of SRS-SpatialRelation Info included in the SRS-Config IE. Here, SRS-SpatialRelation Info is set for each SRS resource and indicates whether the same beamforming as that used for an SSB, a CSI-RS or an SRS will be applied for each SRS resource.

When SRS-SpatialRelationInfo is set for SRS resources, the same beamforming as that used for the SSB, CSI-RS or SRS is applied. However, when SRS-SpatialRelationInfo is not set for SRS resources, the UE arbitrarily determines Tx beamforming and transmits an SRS through the determined Tx beamforming.

Next, a beam failure recovery (BFR) procedure will be described.

In a beamformed system, radio link failure (RLF) may frequently occur due to rotation, movement or beamforming blockage of a UE. Accordingly, NR supports BFR in order to prevent frequent occurrence of RLF. BFR is similar to a radio link failure recovery procedure and can be supported when a UE knows new candidate beams. For beam failure detection, a BS configures beam failure detection reference signals for a UE, and the UE declares beam failure when the number of beam failure indications from the physical layer of the UE reaches a threshold set through RRC signaling within a period set through RRC signaling of the BS. After beam failure detection, the UE triggers beam failure recovery by initiating a random access procedure in a PCell and performs beam failure recovery by selecting a suitable beam. (When the BS provides dedicated random access resources for certain beams, these are prioritized by the UE). Completion of the aforementioned random access procedure is regarded as completion of beam failure recovery.

D. URLLC (Ultra-Reliable and Low Latency Communication)

URLLC transmission defined in NR can refer to (1) a relatively low traffic size, (2) a relatively low arrival rate, (3) extremely low latency requirements (e.g., 0.5 and 1 ms), (4) relatively short transmission duration (e.g., 2 OFDM symbols), (5) urgent services/messages, etc. In the case of UL, transmission of traffic of a specific type (e.g., URLLC) needs to be multiplexed with another transmission (e.g., eMBB) scheduled in advance in order to satisfy more stringent latency requirements. In this regard, a method of providing information indicating preemption of specific resources to a UE scheduled in advance and allowing a URLLC UE to use the resources for UL transmission is provided.

NR supports dynamic resource sharing between eMBB and URLLC. eMBB and URLLC services can be scheduled on non-overlapping time/frequency resources, and URLLC transmission can occur in resources scheduled for ongoing eMBB traffic. An eMBB UE may not ascertain whether PDSCH transmission of the corresponding UE has been partially punctured and the UE may not decode a PDSCH due to corrupted coded bits. In view of this, NR provides a preemption indication. The preemption indication may also be referred to as an interrupted transmission indication.

With regard to the preemption indication, a UE receives DownlinkPreemption IE through RRC signaling from a BS. When the UE is provided with DownlinkPreemption IE, the UE is configured with INT-RNTI provided by a parameter int-RNTI in DownlinkPreemption IE for monitoring of a PDCCH that conveys DCI format 2_1. The UE is additionally configured with a corresponding set of positions for fields in DCI format 2_1 according to a set of serving cells and positionInDCI by INT-ConfigurationPerServing Cell including a set of serving cell indexes provided by servingCellID, configured having an information payload size for DCI format 2_1 according to dci-Payloadsize, and configured with indication granularity of time-frequency resources according to timeFrequencySect.

The UE receives DCI format 2_1 from the BS on the basis of the DownlinkPreemption IE.

When the UE detects DCI format 2_1 for a serving cell in a configured set of serving cells, the UE can assume that there is no transmission to the UE in PRBs and symbols indicated by the DCI format 2_1 in a set of PRBs and a set of symbols in a last monitoring period before a monitoring period to which the DCI format 2_1 belongs. For example, the UE assumes that a signal in a time-frequency resource indicated according to preemption is not DL transmission scheduled therefor and decodes data on the basis of signals received in the remaining resource region.

E. mMTC (Massive MTC)

mMTC (massive Machine Type Communication) is one of 5G scenarios for supporting a hyper-connection service providing simultaneous communication with a large number of UEs. In this environment, a UE intermittently performs communication with a very low speed and mobility. Accordingly, a main goal of mMTC is operating a UE for a long time at a low cost. With respect to mMTC, 3GPP deals with MTC and NB (NarrowBand)-IoT.

mMTC has features such as repetitive transmission of a PDCCH, a PUCCH, a PDSCH (physical downlink shared channel), a PUSCH, etc., frequency hopping, retuning, and a guard period.

That is, a PUSCH (or a PUCCH (particularly, a long PUCCH) or a PRACH) including specific information and a PDSCH (or a PDCCH) including a response to the specific information are repeatedly transmitted. Repetitive transmission is performed through frequency hopping, and for repetitive transmission, (RF) retuning from a first frequency resource to a second frequency resource is performed in a guard period and the specific information and the response to the specific information can be transmitted/received through a narrowband (e.g., 6 resource blocks (RBs) or 1 RB).

F. Basic Operation between User Equipments Using 5G Communication

Figure 3:
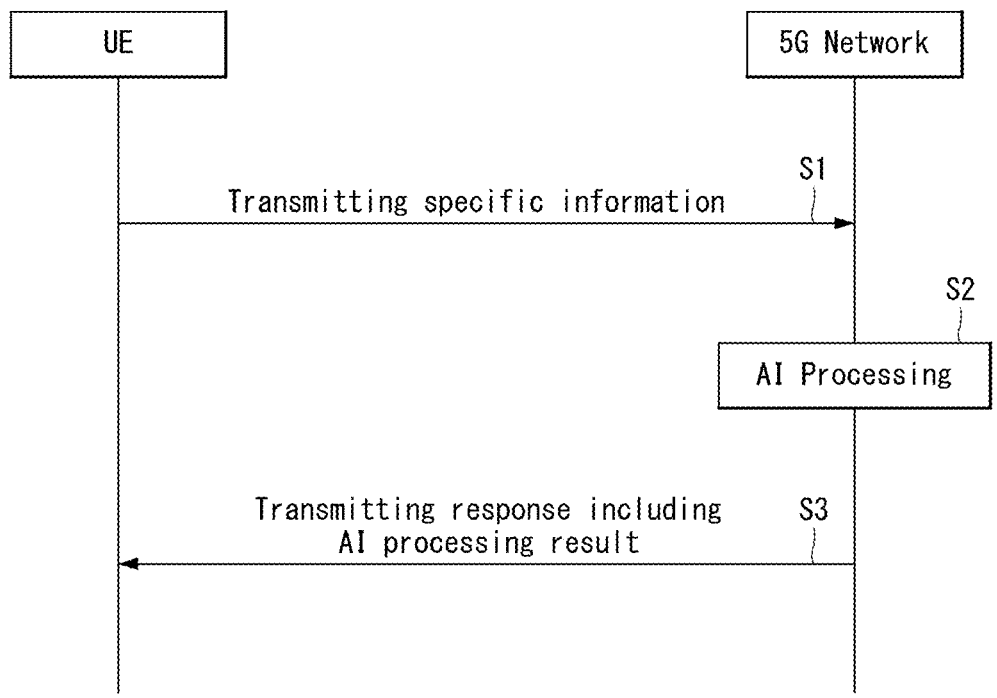
FIG. 3 shows an example of basic operations of an autonomous vehicle and a 5G network in a 5G communication system.

FIG. 3 shows an example of basic operations of a user equipment and a 5G network in a 5G communication system.

The user equipment transmits specific information to the 5G network (S1). The specific information may include autonomous driving related information. In addition, the 5G network can determine whether to remotely control the vehicle (S2). Here, the 5G network may include a server or a module which performs remote control related to autonomous driving. In addition, the 5G network can transmit information (or signal) related to remote control to the user equipment (S3).

G. Applied Operations between User Equipment and 5G Network in 5G Communication System Hereinafter, the operation of a user equipment using 5G communication will be described in more detail with reference to wireless communication technology (BM procedure, URLLC, mMTC, etc.) described in FIGS. 1 and 2.

First, a basic procedure of an applied operation to which a method proposed by the present invention which will be described later and eMBB of 5G communication are applied will be described.

As in steps S1 and S3 of FIG. 3, the user equipment performs an initial access procedure and a random access procedure with the 5G network prior to step S1 of FIG. 3 in order to transmit/receive signals, information and the like to/from the 5G network.

More specifically, the user equipment performs an initial access procedure with the 5G network on the basis of an SSB in order to acquire DL synchronization and system information. A beam management (BM) procedure and a beam failure recovery procedure may be added in the initial access procedure, and quasi-co-location (QCL) relation may be added in a process in which the user equipment receives a signal from the 5G network.

In addition, the user equipment performs a random access procedure with the 5G network for UL synchronization acquisition and/or UL transmission. The 5G network can transmit, to the user equipment, a UL grant for scheduling transmission of specific information. Accordingly, the user equipment transmits the specific information to the 5G network on the basis of the UL grant. In addition, the 5G network transmits, to the user equipment, a DL grant for scheduling transmission of 5G processing results with respect to the specific information. Accordingly, the 5G network can transmit, to the user equipment, information (or a signal) related to remote control on the basis of the DL grant.

Next, a basic procedure of an applied operation to which a method proposed by the present invention which will be described later and URLLC of 5G communication are applied will be described.

As described above, a user equipment can receive DownlinkPreemption IE from the 5G network after the user equipment performs an initial access procedure and/or a random access procedure with the 5G network. Then, the user equipment receives DCI format 2_1 including a preemption indication from the 5G network on the basis of DownlinkPreemption IE. The user equipment does not perform (or expect or assume) reception of eMBB data in resources (PRBs and/or OFDM symbols) indicated by the preemption indication. Thereafter, when the user equipment needs to transmit specific information, the user equipment can receive a UL grant from the 5G network.

Next, a basic procedure of an applied operation to which a method proposed by the present invention which will be described later and mMTC of 5G communication are applied will be described.

Description will focus on parts in the steps of FIG. 3 which are changed according to application of mMTC.

In step S1 of FIG. 3, the user equipment receives a UL grant from the 5G network in order to transmit specific information to the 5G network. Here, the UL grant may include information on the number of repetitions of transmission of the specific information and the specific information may be repeatedly transmitted on the basis of the information on the number of repetitions. That is, the user equipment transmits the specific information to the 5G network on the basis of the UL grant. Repetitive transmission of the specific information may be performed through frequency hopping, the first transmission of the specific information may be performed in a first frequency resource, and the second transmission of the specific information may be performed in a second frequency resource. The specific information can be transmitted through a narrowband of 6 resource blocks (RBs) or 1 RB.

The above-described 5G communication technology can be combined with methods proposed in the present invention which will be described later and applied or can complement the methods proposed in the present invention to make technical features of the methods concrete and clear.

AI Device

Figure 4:
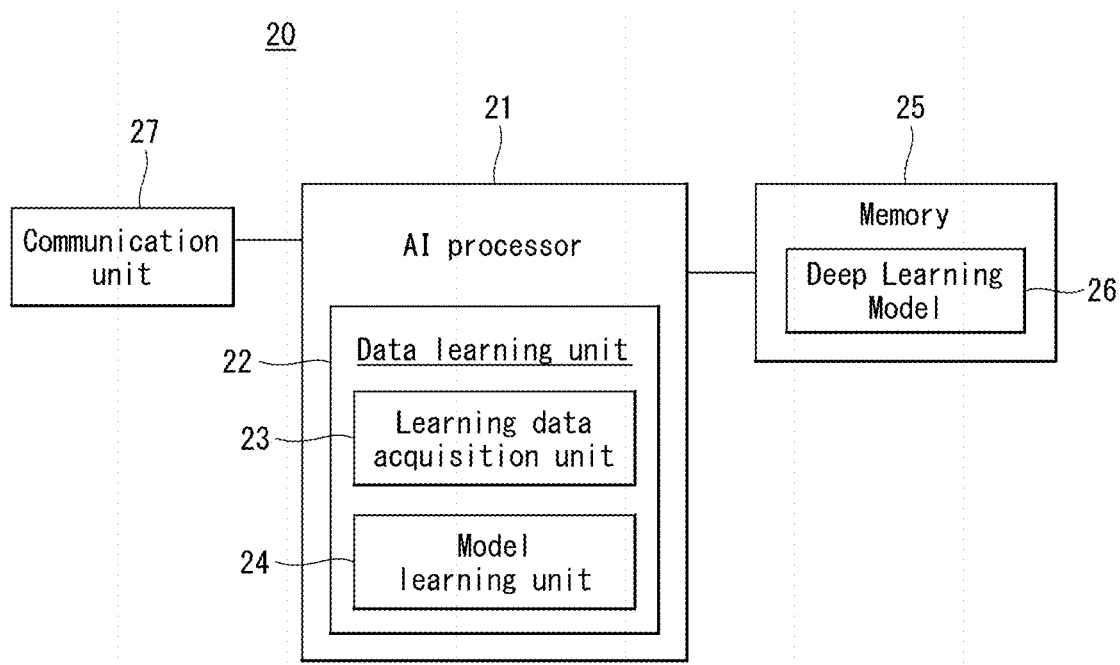
FIG. 4 is a block diagram illustrating an AI device according to an embodiment of the disclosure.

FIG. 4 is a block diagram of an AI device in accordance with the embodiment of the present disclosure.

The AI device 20 may include electronic equipment that includes an AI module to perform AI processing or a server that includes the AI module.

The AI device 20 may include an AI processor 21, a memory 25 and/or a communication unit 27.

The AI processing may include all operations related to control of the device disclosed in the present disclosure. For example, when the device is an autonomous vehicle, the autonomous vehicle may perform processing/decision and control signal generation operations by AI processing of sensing data or driver data, or perform autonomous driving control by AI processing of the data acquired through interaction with other electronic devices in the vehicle. In addition, for example, when the device is an IoT device (e.g. intelligent home appliance, intelligent mobile terminal, etc.), the IoT device may perform processing/decision and control signal generation operations by AI processing of sensing data or user data, or perform a control operation of the IoT device by AI processing of data acquired through interaction with other electronic devices in the IoT device The AI device 20 may be a computing device capable of learning a neural network, and may be implemented as various electronic devices such as a server, a desktop PC, a laptop PC or a tablet PC.

The AI processor 21 may learn the neural network using a program stored in the memory 25. Particularly, the AI processor 21 may learn the neural network for recognizing data related to the intelligent refrigerator 100. Here, the neural network for recognizing data related to the intelligent refrigerator 100 may be designed to simulate a human brain structure on the computer, and may include a plurality of network nodes having weights that simulate the neurons of the human neural network. The plurality of network nodes may exchange data according to the connecting relationship to simulate the synaptic action of neurons in which the neurons exchange signals through synapses. Here, the neural network may include the deep learning model developed from the neural network model. While the plurality of network nodes is located at different layers in the deep learning model, the nodes may exchange data according to the convolution connecting relationship. Examples of the neural network model include various deep learning techniques, such as a deep neural network (DNN), a convolution neural network (CNN), a recurrent neural network (RNN, Recurrent Boltzmann Machine), a restricted Boltzmann machine (RBM,), a deep belief network (DBN) or a deep Q-Network, and may be applied to fields such as computer vision, voice recognition, natural language processing, voice/signal processing or the like.

Meanwhile, the processor performing the above-described function may be a general-purpose processor (e.g. CPU), but may be an AI dedicated processor (e.g. GPU) for artificial intelligence learning.

The memory 25 may store various programs and data required to operate the AI device 20. The memory 25 may be implemented as a non-volatile memory, a volatile memory, a flash memory), a hard disk drive (HDD) or a solid state drive (SDD). The memory 25 may be accessed by the AI processor 21, and reading/writing/correcting/deleting/update of data by the AI processor 21 may be performed.

Furthermore, the memory 25 may store the neural network model (e.g. the deep learning model 26) generated through a learning algorithm for classifying/recognizing data in accordance with the embodiment of the present disclosure.

The AI processor 21 may include a data learning unit 22 which learns the neural network for data classification/recognition. The data learning unit 22 may learn a criterion about what learning data is used to determine the data classification/recognition and about how to classify and recognize data using the learning data. The data learning unit 22 may learn the deep learning model by acquiring the learning data that is used for learning and applying the acquired learning data to the deep learning model.

The data learning unit 22 may be made in the form of at least one hardware chip and may be mounted on the AI device 20. For example, the data learning unit 22 may be made in the form of a dedicated hardware chip for the artificial intelligence AI, and may be made as a portion of the general-purpose processor (CPU) or the graphic dedicated processor (GPU) to be mounted on the AI device 20. Furthermore, the data learning unit 22 may be implemented as a software module. When the data learning unit is implemented as the software module (or a program module including instructions), the software module may be stored in a non-transitory computer readable medium. In this case, at least one software module may be provided by an operating system (OS) or an application.

The data learning unit 22 may include the learning-data acquisition unit 23 and the model learning unit 24.

The learning-data acquisition unit 23 may acquire the learning data needed for the neural network model for classifying and recognizing the data. For example, the learning-data acquisition unit 23 may acquire vehicle data and/or sample data which are to be inputted into the neural network model, as the learning data.

The model learning unit 24 may learn to have a determination criterion about how the neural network model classifies predetermined data, using the acquired learning data. The model learning unit 24 may learn the neural network model, through supervised learning using at least some of the learning data as the determination criterion. Alternatively, the model learning unit 24 may learn the neural network model through unsupervised learning that finds the determination criterion, by learning by itself using the learning data without supervision. Furthermore, the model learning unit 24 may learn the neural network model through reinforcement learning using feedback on whether the result of situation determination according to the learning is correct. Furthermore, the model learning unit 24 may learn the neural network model using the learning algorithm including error back-propagation or gradient descent.

If the neural network model is learned, the model learning unit 24 may store the learned neural network model in the memory. The model learning unit 24 may store the learned neural network model in the memory of the server connected to the AI device 20 with a wire or wireless network.

The data learning unit 22 may further include a learning-data preprocessing unit (not shown) and a learning-data selection unit (not shown) to improve the analysis result of the recognition model or to save resources or time required for generating the recognition model.

The learning-data preprocessing unit may preprocess the acquired data so that the acquired data may be used for learning for situation determination. For example, the learning-data preprocessing unit may process the acquired data in a preset format so that the model learning unit 24 may use the acquired learning data for learning for image recognition.

Furthermore, the learning-data selection unit may select the data required for learning among the learning data acquired by the learning-data acquisition unit 23 or the learning data preprocessed in the preprocessing unit. The selected learning data may be provided to the model learning unit 24. For example, the learning-data selection unit may select only data on the object included in a specific region as the learning data, by detecting the specific region in the image acquired by the camera of the intelligent refrigerator 100.

Furthermore, the data learning unit 22 may further include a model evaluation unit (not shown) to improve the analysis result of the neural network model.

When the model evaluation unit inputs evaluated data into the neural network model and the analysis result outputted from the evaluated data does not satisfy a predetermined criterion, the model learning unit 22 may learn again. In this case, the evaluated data may be predefined data for evaluating the recognition model. By way of example, the model evaluation unit may evaluate that the predetermined criterion is not satisfied when the number or ratio of the evaluated data in which the analysis result is inaccurate among the analysis result of the learned recognition model for the evaluated data exceeds a preset threshold.

The communication unit 27 may transmit the AI processing result by the AI processor 21 to the external electronic equipment.

Although the AI device 20 illustrated in FIG. 4 is functionally divided into the AI processor 21, the memory 25, the communication unit 27 and the like, it is to be noted that the above-described components are integrated into one module, which is referred to as an AI module.

Figure 5:
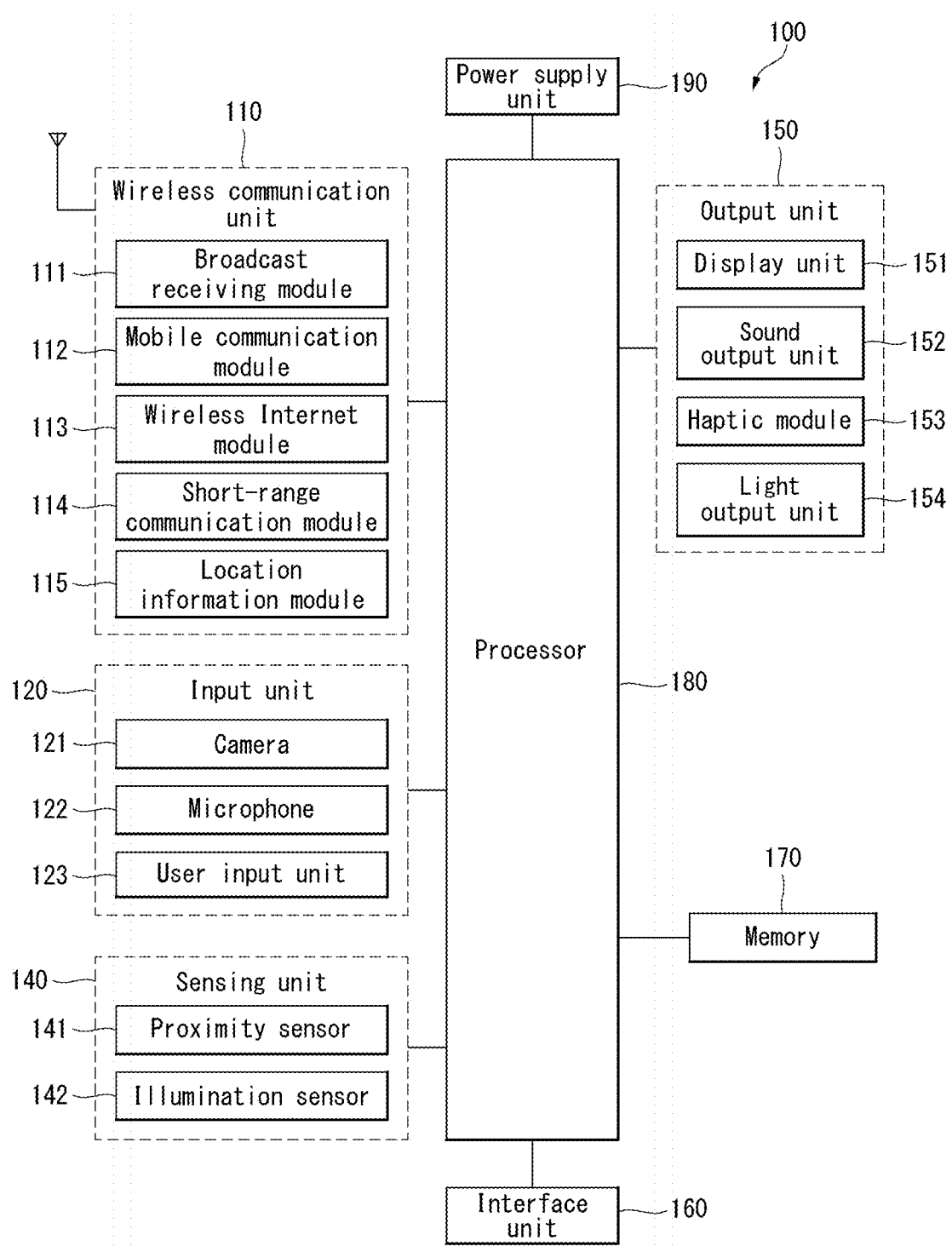
FIG. 5 is a block diagram illustrating a mobile terminal related to the present disclosure.
Figure 6:
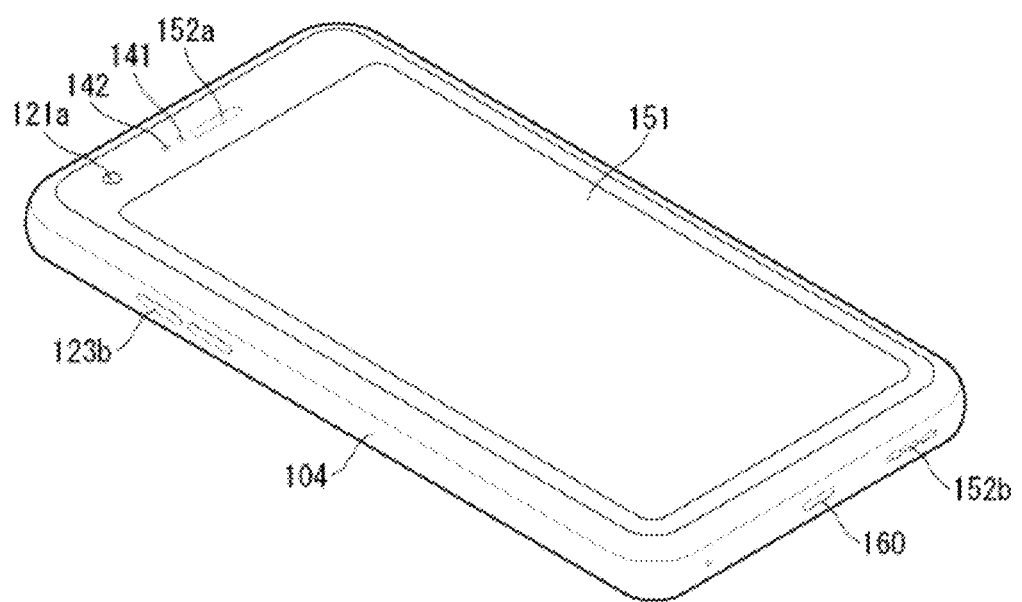
FIGS. 6 and 7 are conceptual diagrams of an example of a mobile terminal related to the present disclosure as viewed from different directions.
Figure 7:
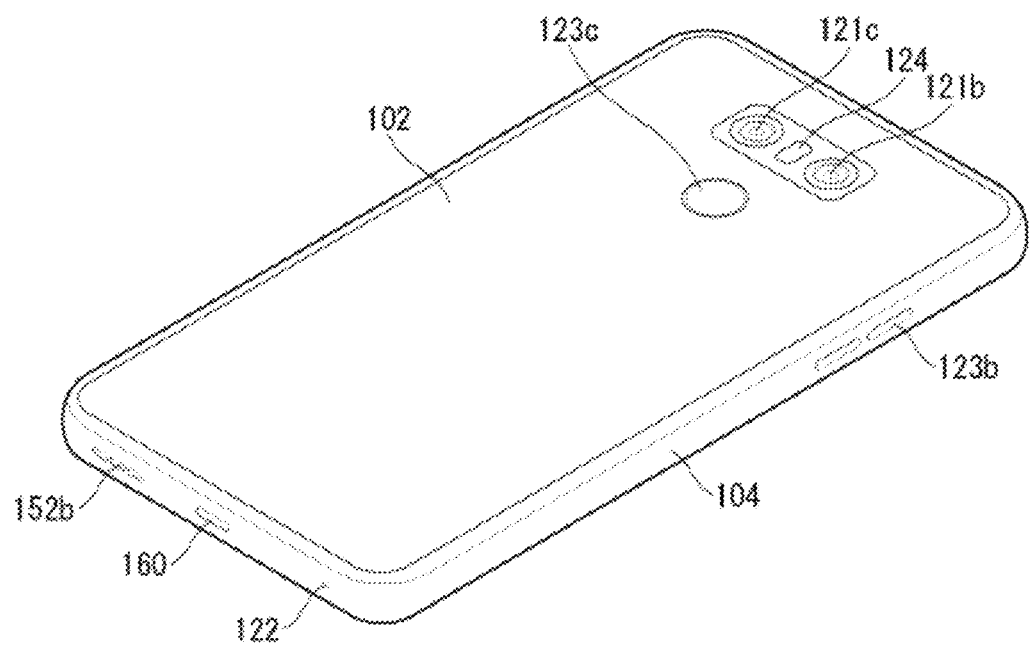

FIG. 5 is a block diagram illustrating a mobile terminal related to the present disclosure, and FIGS. 6 and 7 are conceptual diagrams of an example of a mobile terminal related to the present disclosure as viewed from different directions.

The mobile terminal 100 may include a wireless communication unit 110, an input unit 120, a sensing unit 140, an output unit 150, an interface unit 160, a memory 170, a processor 180, a power supply unit 190 and the like. The components shown in FIG. 5 are not essential to implement the mobile terminal, and thus the mobile terminal described in the present disclosure may have more or fewer components than those listed above.

More specifically, among the components, the wireless communication unit 110 may include one or more modules that enable wireless communication between the mobile terminal 100 and a wireless communication system, between the mobile terminal 100 and another mobile terminal 100, or between the mobile terminal 100 and an external server. In addition, the wireless communication unit 110 may include one or more modules that connect the mobile terminal 100 to one or more networks.

The wireless communication unit 110 may include at least one of a broadcast receiving module 111, a mobile communication module 112, a wireless internet module 113, a short-range communication module 114, and a location information module 115.

The input unit 120 may include a camera 121 or an image input unit for inputting an image signal, a microphone 122 or an audio input unit for inputting an audio signal, and a user input unit 123 (for example, a touch key, a mechanical key, etc.) for receiving information from a user. The voice data or image data collected by the input unit 120 may be analyzed and processed as a user's control command.

The sensing unit 140 may include one or more sensors for sensing at least one of information in the mobile terminal, environment information surrounding the mobile terminal and user information. For example, the sensing unit 140 may include at least one of a proximity sensor 141, an illumination sensor 142, a touch sensor, an acceleration sensor, a magnetic sensor, a gravity sensor (G-sensor), a gyroscope sensor, a motion sensor, an RGB sensor, an infrared sensor (IR sensor), a fingerprint scan sensor, an ultrasonic sensor, an optical sensor (e.g. camera 121), a microphone (122), a battery gauge, an environmental sensor (e.g. barometer, hygrometer, thermometer, radiation detection sensor, heat detection sensor, gas detection sensor, etc.), and a chemical sensor (e.g. an electronic nose, a healthcare sensor, a biometric sensor, etc.). Meanwhile, the mobile terminal disclosed in the present disclosure may combine and utilize information sensed by at least two or more of these sensors.

The output unit 150 is for generating an output related to visual, auditory or tactile sense, and may include at least one of a display unit 151, a sound output unit 152, a haptic module 153, and a light output unit 154.

The display unit 151 may form a layer structure or are integrally formed with the touch sensor, thereby implementing a touch screen. Such a touch screen may function as the user input unit 123 that provides an input interface between the mobile terminal 100 and the user, at the same time, and may provide an output interface between the mobile terminal 100 and the user.

The sound output unit 152 may include a plurality of sound output units, and include a first sound output unit 152*a* located at the front as shown in FIG. 6 and a second sound output unit 152*b* located at the rear as shown in FIG. 7. The first sound output unit 152*a* may be widely used to listen closely to a user' ear during a call, and the second sound output unit 152*b* may be used for listening in a separated state. Accordingly, the output of the second sound output unit 152*b* may be relatively larger than that of the first sound output unit 152*a*.

The interface unit 160 serves as a passage with various types of external devices connected to the mobile terminal 100. The interface unit 160 may include at least one of a wired/wireless headset port, an external charger port, a wired/wireless data port, a memory card port, a port for connecting a device equipped with an identification module, an audio input/output (I/O) port, a video input/output (I/O) port and an earphone port. The mobile terminal 100 may perform appropriate control related to the connected external device in response to the connection of the external device to the interface unit 160.

In addition, the memory 170 stores data supporting various functions of the mobile terminal 100. The memory 170 may store a plurality of application programs or applications run on the mobile terminal 100, data and commands for the operation of the mobile terminal 100. At least some of these application programs may be downloaded from an external server through wireless communication. In addition, at least some of these application programs may exist on the mobile terminal 100 from the time of production for basic functions of the mobile terminal 100 (e.g. call incoming, and outgoing functions, message receiving, and outgoing functions). On the other hand, the application program may be stored in the memory 170, installed on the mobile terminal 100, and run to perform an operation (or function) of the mobile terminal by the processor 180.

The processor 180 controls the general operation of the mobile terminal 100 in addition to the operation related to the application program. The processor 180 may provide or process appropriate information or functions to the user by processing signals, data, information, etc. that are input or output through the above-described components, or by running the application program stored in the memory 170.

In addition, the processor 180 may control at least some of the components discussed with reference to FIG. 5 in order to run the application program stored in the memory 170. Further, the processor 180 may operate by combining at least two or more of the components included in the mobile terminal 100 with each other in order to run the above application program.

The power supply unit 190 receives external power and internal power to supply power to each of the components included in the mobile terminal 100 under the control of the processor 180. The power supply unit 190 includes a battery, and the battery may be a built-in battery or a replaceable battery.

At least some of the components may operate in cooperation with each other to implement an operation, control, or control method of a mobile terminal according to various embodiments described below. In addition, the operation, control, or control method of the mobile terminal may be implemented on the mobile terminal by running at least one application program stored in the memory 170.

Figure 10:
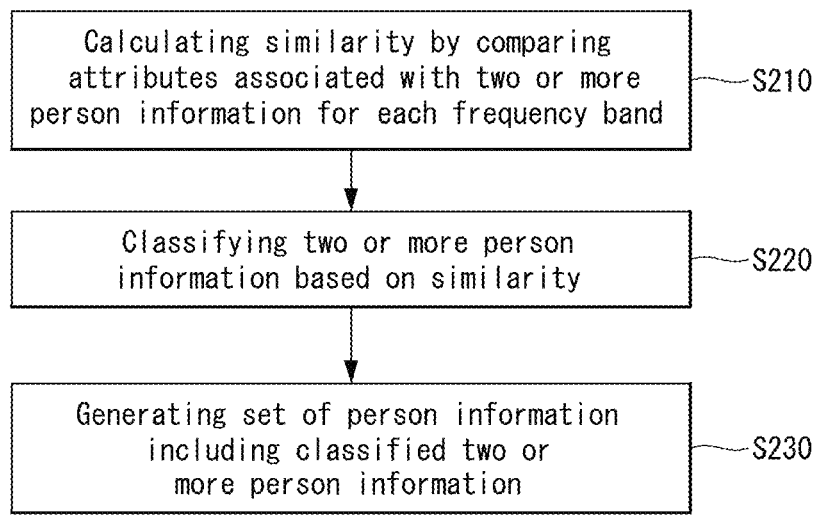
FIG. 10 is a flowchart specifically illustrating S120 of FIG. 9.

Referring to FIGS. 6 and 10, the disclosed mobile terminal 100 has a bar-shaped terminal body. However, the present disclosure is not limited thereto and may be applied to various structures such as a watch type, a clip type, a glass type or a folder type in which two or more bodies are combined so that they can be moved relative to each other, a flip type, a slide type, a swing type, and a swivel type. Although it will relate to a specific type of mobile terminal, the description of the specific type of mobile terminal may be applied generally to other types of mobile terminals.

Here, the terminal body may be understood as a concept referring to the mobile terminal 100 as at least one terminal assembly.

The mobile terminal 100 includes a housing (e.g. a housing, a window, etc.) forming an exterior. Conventionally, front and rear surfaces of the mobile terminal 100 are configured using a front case and a rear case, and electronic components are mounted in an internal space between the front case and the rear case. However, in recent years, as the size of the display unit 151 increases, the display unit 151 occupies a significant portion of the front surface, and the size of the window 151*a* that protects the front surface of the display unit 151 is expanded to cover the entire front surface of the mobile terminal 100. At this time, the circumference of the rear case 102 may protrude in the front direction to cover a side surface of the mobile terminal 100.

Instead of omitting the front case, a middle frame 105 is provided to reinforce the rigidity of the mobile terminal 100 while supporting the rear surface of the display unit 151 and electronic components are mounted on the rear surface of the middle frame 105 and the rear case is coupled to the rear surface to configure the housing of the mobile terminal 100.

A side case 104 covering the side surface of the mobile terminal 100 may be separately provided, and the side case 104 may be configured integrally with the middle frame 105 described above. That is, a part exposed to the outside in the circumferential part of the middle frame 105 may be the side case 104. When the side case 104 includes a metal material, the side case 104 may be used as a part of the antenna, and the rear case 102 may be made of a material different from the side case 104. A design in which a metal or glass material is applied to the rear case 102 is adopted.

As described above, the housing forming the exterior of the mobile terminal 100 includes a plurality of cases 102 and 104 and a window 151*a*, and water may flow into the gap between the cases 102 and 104 and the window 151*a*. A waterproof tape, waterproof bond, resin, rubber, or elastic waterproof ring 108 that shields between the cases 102 and 104 and the window 151*a* of the mobile terminal 100 for waterproofing may be used to shield water from inflow into the internal space in which the components are mounted. As the functions of the mobile terminal 100 are diversified, the waterproof function is becoming an essential function because the mobile terminal 100 is used even in a swimming pool or rainy situation.

On the front of the mobile terminal 100, the display unit 151, the first sound output unit 152*a*, the proximity sensor 141, the illumination sensor 142, the light output unit 154, a first camera 121*a*, and a front input unit (not shown) may be disposed on the front surface, and some of the above components may be omitted or may be disposed on other parts in order to increase the size of the front display unit 151 on the front surface.

The mobile terminal 100 in which a side input unit 123*b*, the microphone 122, the second sound output unit 152*b*, and the interface unit 160 are disposed on the side surface of the mobile terminal 100 and a second camera 121*b* and a rear input unit 123*c* are disposed on the rear surface of the terminal body will be described as an example. This arrangement is not limited and the side input unit 123*b*, the microphone 122, the second sound output unit 152*b*, and the interface unit 160 may be omitted or may be disposed on the rear or front surface of the mobile terminal 100.

The display unit 151 displays (outputs) information processed by the mobile terminal 100. For example, the display unit 151 may display execution screen information of an application program running in the mobile terminal 100, or UI (User Interface) and GUI (Graphic User Interface) information according to the execution screen information.

The light output unit 154 is configured to output light for notifying when an event occurs. Examples of the event may include message reception, call signal reception, missed call, alarm, schedule notification, e-mail reception, and information reception through an application. When the user's event confirmation is detected, the processor 180 may control the light output unit 154 to terminate the light output.

The first camera 121*a* processes an image frame of a still image or a moving image obtained by an image sensor in a photographing mode or a video call mode. The processed image frame may be displayed on the display unit 151 and may be stored in the memory 170.

Contents input by the front input unit and the side input unit 123*a* and 123*b* may be variously set. For example, the front input unit may receive commands such as menu, home key, cancel, and search, etc., and the side input unit 123*b* may receive commands such as adjusting the volume of the sound output from the first or second sound output units 152*a* and 152*b*, and switching to the touch recognition mode of the display unit 151, etc.

Meanwhile, as another example of the user input unit 123, a rear input unit 123*c* may be provided on the rear surface of the terminal body. The rear input unit 123*c* is manipulated to receive a command for controlling the operation of the mobile terminal 100, and input contents may be variously set. For example, commands such as power on/off, start, end, and scroll, etc., and commands such as adjusting the volume of sound output from the first and second sound output units 152*a* and 152*b* and switching to the touch recognition mode of the display unit 151 may be input. The rear input unit 123*c* may be implemented in a form capable of inputting by a touch input, a push input, or a combination thereof.

The rear input unit 123*c* may be disposed to overlap with the display unit 151 on the front surface in the thickness direction of the terminal body. As an example, when the user holds the terminal body with one hand, the rear input unit 123*c* may be disposed on the rear upper end of the terminal body so that the user can easily manipulate the terminal body using the index finger. However, the present disclosure is not necessarily limited thereto, and the position of the rear input unit 123*c* may be changed.

When the rear input unit 123*c* is provided on the rear surface of the body of the terminal 100, a new type of user interface can be implemented using the rear input unit 123*c*. In addition, when the touch screen or the rear input unit 123*c* described above replaces at least some functions of the front input unit provided on the front of the terminal body, and the front input unit is not disposed on the front of the terminal body, the display unit 151 may be configured with a larger screen.

On the other hand, the mobile terminal 100 may be provided with a fingerprint recognition sensor for recognizing a user's fingerprint, and the processor 180 may use the fingerprint information sensed through the fingerprint recognition sensor as an authentication means. The fingerprint recognition sensor may be built in the display unit 151 or the user input unit 123.

The microphone 122 is configured to receive a user's voice, other sounds, and the like. The microphone 122 may be provided in a plurality of locations and configured to receive stereo sound.

The interface unit 160 is a passage through which the mobile terminal 100 can be connected to an external device. For example, the interface unit 160 may be at least one of a connection terminal for connection with other devices (e.g. an earphone, an external speaker), a port for short-range communication [e.g. an infrared (IrDA) port, a bluetooth port, or a wireless LAN port, etc.], or a power supply terminal for supplying power to the mobile terminal 100. The interface unit 160 may be implemented in the form of a socket for receiving an external card such as a subscriber identification module (SIM) or a user identity module (UIM), or a memory card for storing information.

The second camera 121b may be disposed on the rear surface of the terminal body. In this case, the second camera 121b has a photographing direction substantially opposite to that of the first camera 121a.

The second camera 121b may include a plurality of lenses arranged along at least one line. The plurality of lenses may be arranged in a matrix format. Such a camera may be referred to as an 'array camera'. When the second camera 121b is configured as the array camera, an image may be photographed in various ways using the plurality of lenses, and an image of better quality may be obtained.

A flash 124 may be disposed adjacent to the second camera 121b. The flash 124 illuminates light toward a subject when photographing the subject with the second camera 121b.

The second sound output unit 152b may be additionally disposed on the terminal body. The second sound output unit 152b may implement a stereo function together with the first sound output unit 152a, and may be used to implement a speakerphone mode during a call.

The terminal body may be provided with at least one antenna for wireless communication. The antenna may be built in the terminal body or may be formed in the case. For example, an antenna that forms a part of the broadcast receiving module 111 (refer to FIG. 5) may be configured to be retractable from the terminal body. Alternatively, the antenna may be formed in a film type and attached to the inner surface of the rear cover 103, or a case including a conductive material may be configured to function as an antenna.

The terminal body is provided with the power supply unit 190 (see FIG. 5) for supplying power to the mobile terminal 100. The power supply unit 190 may include a battery 191 built in the terminal body or configured to be detachable from the outside of the terminal body.

The battery 191 may be configured to receive power through a power cable connected to the interface unit 160. In addition, the battery 191 may be configured to enable wireless charging through a wireless charger. The wireless charging may be implemented by a magnetic induction method or a resonance method (magnetic resonance method).

The mobile terminal 100 may be added with an accessory that protects the appearance or assists or expands the function of the mobile terminal 100. An example of such an accessory may be a cover or a pouch that covers or accommodates at least one surface of the mobile terminal 100. The cover or pouch may be configured to interlock with the display unit 151 to expand the functions of the mobile terminal 100. Another example of the accessory may be a touch pen for assisting or expanding the touch input to the touch screen.

Hereinafter, embodiments related to a control method that can be implemented in the mobile terminal configured as described above will be described with reference to the accompanying drawings. It is obvious to those skilled in the art that the present disclosure may be embodied in other specific forms without departing from the spirit and essential features of the present disclosure.

Figure 8:
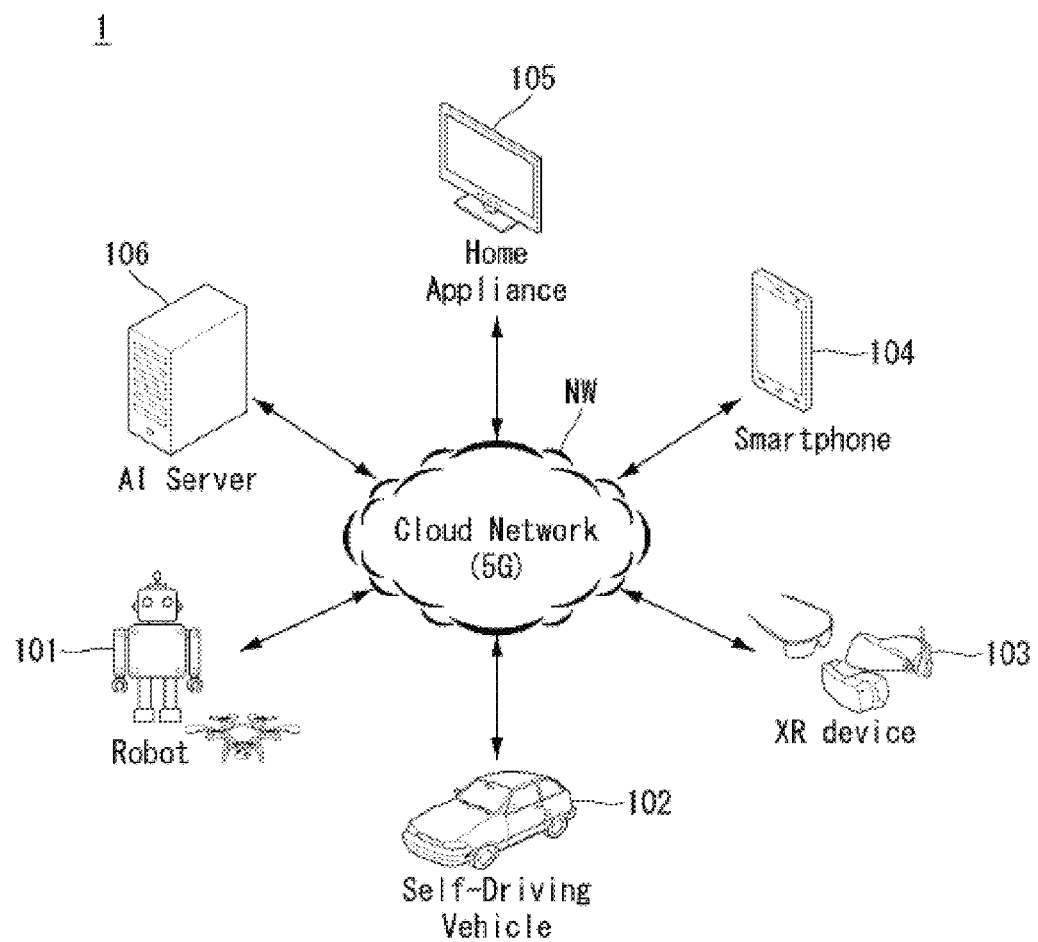
FIG. 8 is a conceptual diagram illustrating an embodiment of an AI device.

FIG. 8 is a conceptual diagram illustrating an embodiment of an AI device.

Referring to FIG. 7, in an AI system 1, at least one of an AI server 106, a robot 101, a self-driving vehicle 102, an XR device 103, a smartphone 104, or a home appliance 105 are connected to a cloud network NW. Here, the robot 101, the self-driving vehicle 102, the XR device 103, the smartphone 104, or the home appliance 105 applied with the AI technology may be referred to as the AI devices 101 to 105.

The cloud network NW may mean a network that forms a part of a cloud computing infrastructure or exists in the cloud computing infrastructure. Here, the cloud network NW may be configured using the 3G network, the 4G or the Long Term Evolution (LTE) network, or the 5G network.

That is, each of the devices 101 to 106 constituting the AI system 1 may be connected to each other through the cloud network NW. In particular, each of the devices 101 to 106 may communicate with each other through a base station, but may communicate directly with each other without going through the base station.

The AI server 106 may include a server performing AI processing and a server performing operations on big data.

The AI server 106 may be connected to at least one of the robots 101, the self-driving vehicle 102, the XR device 103, the smartphone 104, or the home appliance 105, which are AI devices constituting the AI system, through the cloud network NW, and may assist at least some of the AI processing of the connected AI devices 101 to 105.

At this time, the AI server 106 may learn the artificial neural network according to the machine learning algorithm on behalf of the AI devices 101 to 105, and directly store the learning model or transmit it to the AI devices 101 to 105.

At this time, the AI server 106 may receive input data from the AI devices 101 to 105, infer a result value for the received input data using the learning model, generate a response or a control command based on the inferred result value and transmit it to the AI devices 101 to 105.

Alternatively, the AI devices 101 to 105 may infer the result value for the input data directly using the learning model, and generate a response or a control command based on the inferred result value.

A mobile terminal applied to an embodiment of the present disclosure may correspond to any one of the AI devices of FIG. 8. For example, the mobile terminal may correspond to the smartphone 104. The mobile terminal may perform AI by AI processing by the AI processor of various AI devices that can communicate through the cloud network, or by using an AI module (AI device 20 of FIG. 4) provided in an on-device form inside the mobile terminal.

On the other hand, in the call service as described above, the call sound quality of the mobile terminal cannot be personalized according to the sound feature of the far-end, and there is a limitation in that the call sound quality is constantly output. In addition, an uncomfortable sound may be output to the user of the mobile terminal according to the type of the far-end's device, the volume of the voice of the far-end, and the frequency characteristic.

In the following specification, various embodiments for solving the above-described problems and/or tasks will be described.

Figure 9:
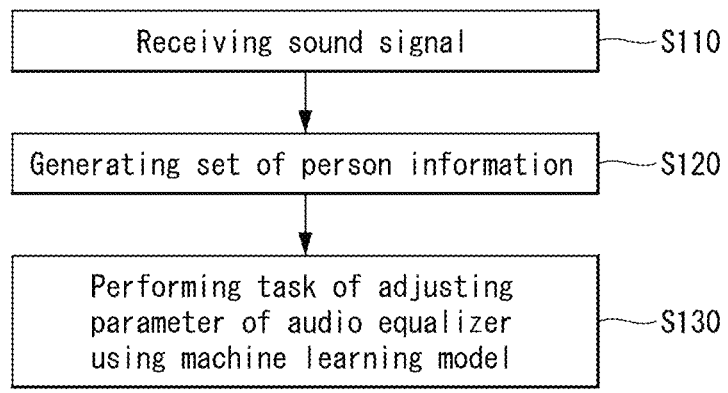
FIG. 9 is a flowchart of a sound control method based on artificial intelligence according to an embodiment of the present disclosure.

FIG. 9 is a flowchart of a sound control method based on artificial intelligence according to an embodiment of the present disclosure.

Referring to FIG. 9, the sound signal may be received and stored in a memory while performing a call with a mobile terminal connected to communication (S110).

In this case, the sound signal may include a voice signal obtained through a microphone of the mobile terminal connected to communication. In addition, the sound signal may include environmental information collected during a call in addition to the voice signal. The environmental information means noise in the space of the mobile terminal. The environment information may be mapped with the location information of the mobile terminal and stored together in the memory. The environment information to which the mobile information is mapped may later be used to provide different call services for each environment of the mobile terminal.

In addition, the mobile terminal may receive the sound signal and simultaneously receive terminal information of the far-end through the transceiver. The terminal information indicates an identifier indicating a device. For reference, the identifier may be used interchangeably with the identification information. In this case, the terminal information may be recorded as an element of person information.

On the other hand, in an example, the sound signal may be received through a microphone for a call of the mobile terminal, and noise may be obtained through a noise microphone provided separately from the microphone for the call in the mobile terminal.

The processor of the mobile terminal may generate at least one set of person information including at least one person information associated with an attribute based on the attribute of the sound signal (S120).

The plurality of frequency bands may include first to Nth bands (N is a natural number), and a frequency bandwidth of Kth band (K is a natural number of 2 or more, K<N) may be an integer multiple of a frequency bandwidth of K-1th band. For example, the frequency band may be divided into 250 Hz, 500 Hz, 1 kHz, and 2 kHz bands.

Further, the attribute may include a feature parameter extracted from the sound signal. Algorithms such as Pitch, Linear Predictive Coding (LPC), and Mel-frequency Cepstrum Coefficient (MFCC) may be used to extract the feature parameter. For example, the attribute may include a volume associated with each of a plurality of frequency bands. In this case, the 250 Hz band, 500 Hz band, 1 kHz band, and 2 kHz band may have different volumes. The received sound signals may be grouped according to the weight of each divided frequency band.

The person information means address information stored in the memory by an address application of the mobile terminal. For example, the person information may include information on the name, age, sex, and occupation of a specific person, and the person information may be recorded in the memory of the mobile terminal according to the user's input, or received through the network and recorded in the memory. On the other hand, the person information may be used interchangeably with the address information. In addition, the person information may further include voice information (e.g. sound feature of voice) mapped to the person information.

The set of person information means a group including one or more person information. On the other hand, the group may be used interchangeably with a cluster. The grouping may be performed manually according to a user's input, or may be dynamically performed by the processor of the mobile terminal as described later in FIG. 10.

A task of adjusting a parameter of an audio equalizer based on information representing the set of person information and a feature vector of the sound signal may be performed using a machine learning model (S130).

In this case, the parameter of the audio equalizer may include a frequency, a gain, or a Q-Factor. For example, the processor may adjust the gain or Q-Factor for each of the aforementioned plurality of frequency bands. As a result, the call sound quality of the mobile terminal may be changed based on the adjusted parameter of the equalizer.

The information representing the set of person information means identification information representing the set of person information. For example, a plurality of sets of person information may have a vector or coefficient to be classified. In this case, the classified vector or coefficient may be input through at least one node provided in an input layer of the machine learning model.

On the other hand, when S120 is dynamically performed by the processor as described later in FIG. 10, the task may be performed in correspondence with a period of a clustering algorithm performed at a set period. In addition, when the clustering algorithm is performed in response to an idle state of the mobile terminal, the task may be performed in response to the generation of the set of person information.

As such, various embodiments of the present disclosure may provide adaptive call sound quality by analyzing features of the sound signal received by the mobile terminal. As a result, even if different call quality for each far-end is received through the transceiver of the mobile terminal, the speaker for a call of the user's mobile terminal may provide a personalized call environment.

In addition, according to various embodiments of the present disclosure, by receiving an identifier of the far-end's terminal together with the sound signal, it is not limited to the voice feature of the far-end, and the difference in call sound quality provided differently according to the call-related performance of the far-end's terminal can also be adjusted to be personalized.

FIG. 10 is a flowchart specifically illustrating S120 of FIG. 9.

Referring to FIG. 10, the processor of the mobile terminal may calculate a similarity by comparing attributes associated with two or more person information for each frequency band (S210). For example, the processor may calculate a similarity value such as a distance value or a probability value using algorithms such as a Hidden Markov Model (HMM), a Gaussian Mixture Model (GMM), or a Support Vector Machine (SVM).

The processor may classify the two or more person information based on the similarity (S220).

When performing call processing of the mobile terminal, it is possible to confirm the identification information of the far-end subject to the call processing. The processor may store the voice information in the memory so as to be mapped to the person information of the far-end in response to the end of the call. In this case, the stored voice information may be used for learning a machine learning model for adjusting parameters of the audio equalizer, or may be removed from the memory after a set time elapses.

On the other hand, the processor may generate a plurality of clusters by comparing attributes (i.e. voice information) mapped to two or more person information. As a result, the voice information mapped to person information included in a plurality of generated clusters may exhibit similar sound features.

The processor may generate the set of person information including the classified two or more person information (S230).

For example, a cluster having a strong low tone and a small voice, a cluster having a strong low tone and a large voice, a cluster having a strong high tone and a small voice, and/or a cluster having a strong high tone and a large voice may be generated.

The clustering algorithm of FIG. 10 may be performed at a set period or in response to a transition to the idle state when the mobile terminal is in the idle state.

As such, various embodiments of the present disclosure may provide a sufficient learning environment with relatively little data for learning by performing the clustering. Specifically, when learning is performed for each person information, persons who do not frequently call are hardly learned. However, in the various embodiments of the present disclosure, since learning can be performed on various people included in the cluster, it is possible to provide an improved learning environment for the machine learning model.

Figure 11:
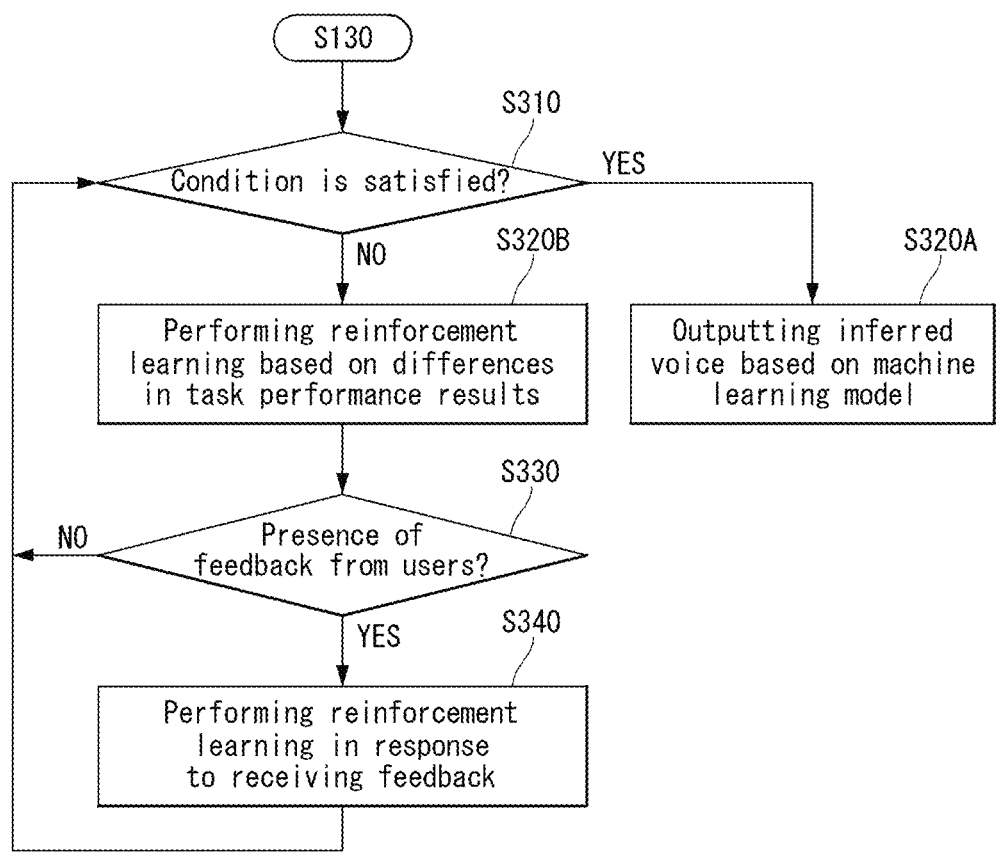
FIG. 11 is a flowchart of a reinforcement learning algorithm of a machine learning model.

FIG. 11 is a flowchart of a reinforcement learning algorithm of a machine learning model.

Referring to FIG. 11, the processor of the mobile terminal compares the parameters of the audio equalizer generated as a result of performing the task in S130 with the parameters of the audio equalizer before the task is performed, and when the set condition is satisfied, may not perform reinforcement learning, and may output an inferred voice based on the machine learning model (S310:YES, S320A).

For example, the set condition means that the similarity is greater than or equal to a preset threshold, and that a manual manipulation signal by a user is not input by comparing values of parameters before and after the task is performed.

The processor may perform reinforcement learning when the set condition is not satisfied (S310: NO, S320B).

When the parameter of the audio equalizer changes from a first state to a second state, the reinforcement learning that adjusts a parameter of the machine learning model may be performed based on a difference between the first and second states.

In addition, the processor may adjust the parameter of the machine learning model in response to receiving feedback on a result of performing the task (S330: YES, S340).

The feedback may be an input for adjusting the parameter of the audio equalizer through a user interface. The user interface may include, for example, a touch screen, an input button, a hot key, and a microphone. The parameters of the audio equalizer may be mapped to the person information and/or the set of person information and stored in the memory. In this case, the degree to which the user has adjusted the parameters of the audio equalizer is used as a reward, so that the reinforcement learning may proceed. For example, the more the tone the user prefers, the less the user will increase the volume, and the more difficult the tone the user understands, the more the user will increase the volume. As the user adjusts the volume more, the preferred volume estimation has failed, so a greater penalty is given.

Figure 12:
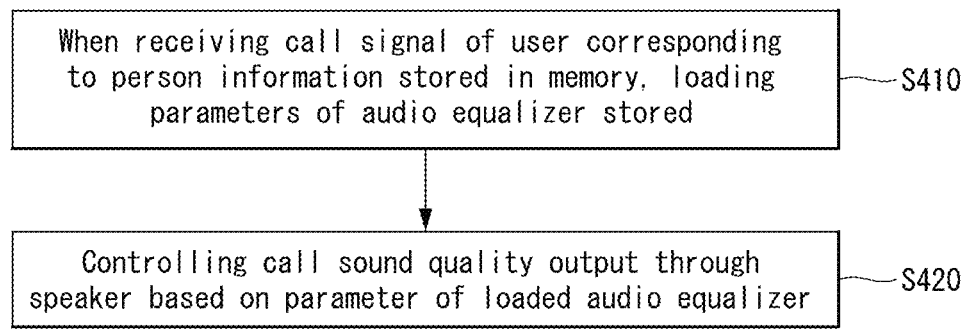
FIG. 12 is a flow chart of a sound control method based on a learned machine learning model.

FIG. 12 is a flow chart of a sound control method based on a learned machine learning model.

Referring to FIG. 12, when receiving a call signal of a user corresponding to the person information stored in the memory, the processor of the mobile terminal may load the parameters of the audio equalizer stored in the memory in response to the call signal (S410).

Here, the parameters of the audio equalizer may be stored in the memory in S320 of FIG. 11. When receiving the call signal, the processor may confirm person information matching the call signal, and receive a parameter of an audio equalizer corresponding to the confirmed person information from the memory. In addition, when the parameter of the audio equalizer is mapped to the set of person information and recorded, the processor may receive the parameter of the audio equalizer corresponding to the set of person information from the memory. The parameter of each audio equalizer may have a different value based on the person information and/or the set of person information.

The processor may control the call sound quality output through the speaker based on the loaded parameter of the audio equalizer (S420).

For example, when it is confirmed as set of first person information, the processor may control the speaker for a call to output sound as a parameter of an audio equalizer associated with the set of the first person information. In addition, when it is confirmed as the first person in the set of the first person information and there is an adjustment history of the parameters of the personalized audio equalizer for the first person, the processor may control the speaker for a call to output sound as a parameter of an audio equalizer associated with the first person in the set of the first person information.

In this way, the processor may provide a personalized call service adaptively to the far-end by controlling the parameters of the audio equalizer based on the person information, controlling based on the set of person information, or controlling based on the person information and the set of person information.

Figure 13:
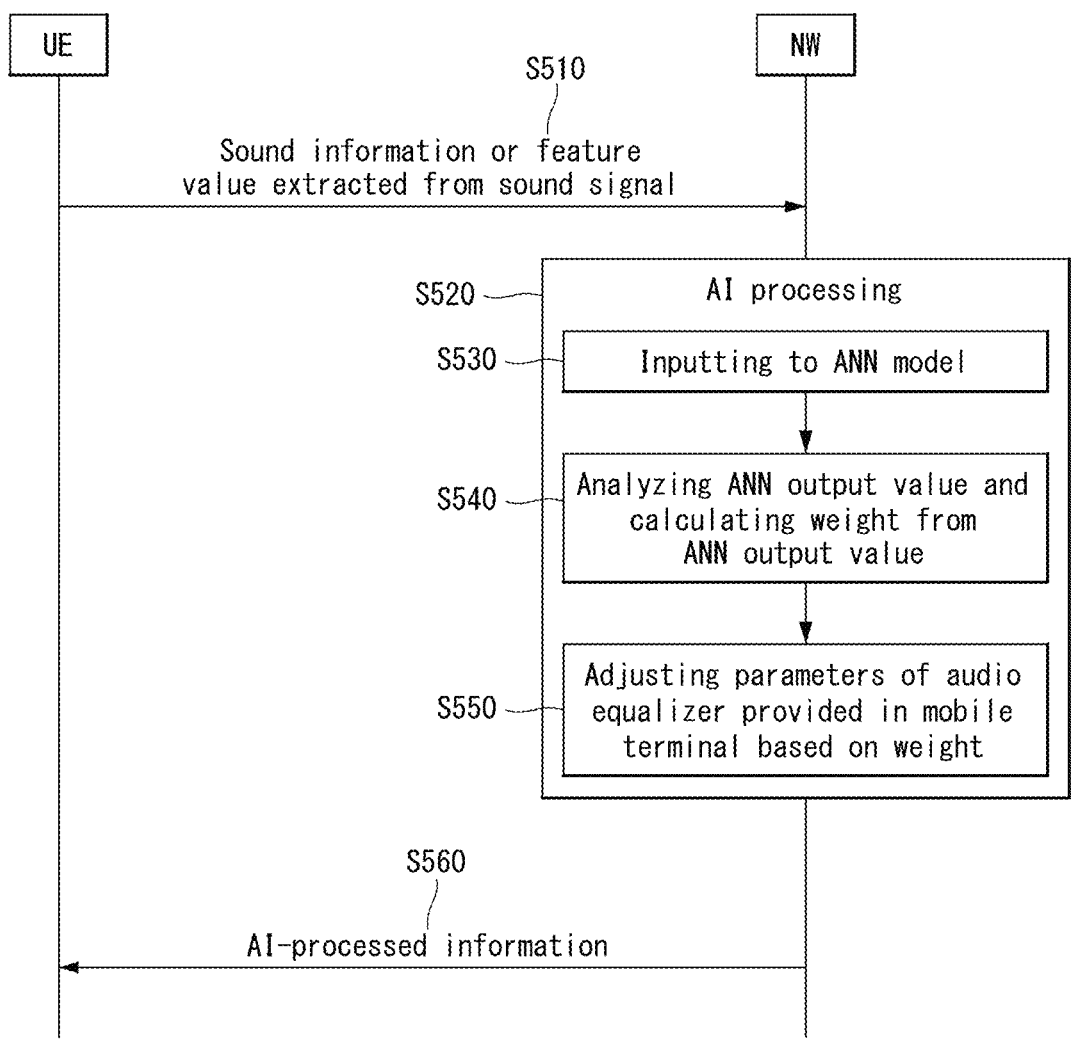
FIG. 13 is a sequence diagram of a sound control method based on a 5G network.

FIG. 13 is a sequence diagram of a sound control method based on a 5G wireless communication system.

AI processing based on a 5G wireless communication system may be performed in connection with an AI processor included in a 5G network. Specifically, the processor may control the transceiver to transmit sound information or feature values extracted from sound signals to the AI processor included in the 5G network. In addition, the processor may control the transceiver to receive AI-processed information from the AI processor.

On the other hand, the processor may perform an initial access procedure with the 5G network in order to transmit the sound information or feature values extracted from the sound signal to the 5G network. The processor may perform the initial access procedure with the 5G network based on a synchronization signal block (SSB).

In addition, the processor may receive downlink control information (DCI) used to schedule transmission of the sound information or feature values extracted from sound signals through the transceiver from the network.

The processor may transmit the sound information or a feature value extracted from the sound signal based on the DCI to the 5G network.

The sound information or the feature value extracted from the sound signal may be transmitted to the 5G network through PUSCH, and the SSB and the DM-RS of the PUSCH may be QCL for QCL type D.

Referring to FIG. 13, the processor may transmit the sound information or the feature value extracted from the sound signal to the 5G network through the transceiver (S510).

Here, the 5G network may include an AI processor or an AI system, and the AI system of the 5G network may perform AI processing based on the received sensing information (S520).

The AI system may input the sound information or feature values received from the mobile terminal to the ANN model (S530). The AI system may analyze an ANN output value and calculate a weight from the ANN output value (S540). The 5G network may adjust the parameters of the audio equalizer provided in the mobile terminal based on the weight calculated by the AI system (S550). The 5G network may transmit AI-processed information to the mobile terminal, and the AI-processed information may include parameters of the adjusted audio equalizer.

Although the embodiment shown in FIG. 13 has been described centering on an embodiment performed by a server or an AI processor, the operation may be performed by a processor of an external device. In addition, the algorithm described above in FIGS. 9 to 12 may be equally applied to the embodiment shown in FIG. 13.

Figure 14:
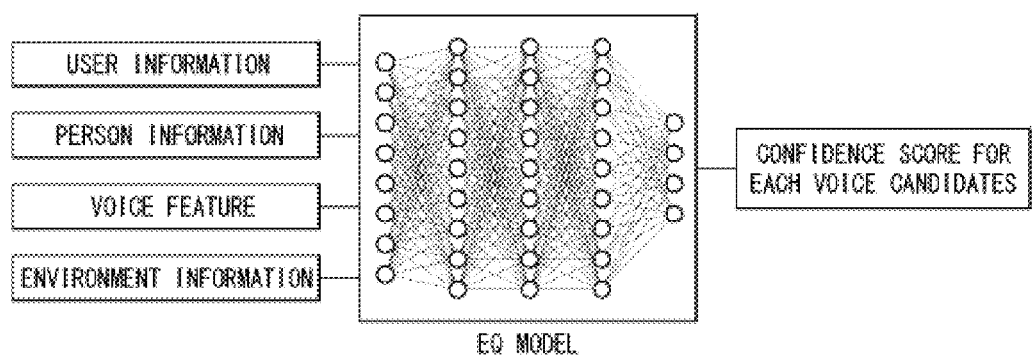

FIGS. 14 and 15 are views for explaining an implementation example of a sound control method according to an embodiment of the present disclosure.

Referring to FIG. 14, the machine learning model applied to an embodiment of the present disclosure may use registered user information of the mobile terminal, registered person information of the far-end, environmental information including noise of the call environment, and/or voice information (or voice feature) of a person mapped to the person information as input data. Here, the voice information of the person may be included as an element of the person information. Further, the person information may further include identification information for distinguishing the type of the terminal (e.g. LG V50S ThinQ, iPhone11, etc.) being used by the far-end.

When the above-described input data is applied, the machine learning model may output a plurality of voice candidates and a confidence score for the voice candidate as an output. Here, the voice candidate means parameter values of various combinations of audio equalizers that can be predicted by the processor of the mobile terminal in response to the input of the above-described input data. For example, a first candidate and a second candidate may have different gains for each frequency band.

When a softmax layer and an argmax layer are applied to the machine learning model, the softmax layer may calculate a probability value for each of a plurality of candidates, and the machine learning model may select one candidate from among the plurality of candidates based on the argmax layer.

Referring to FIG. 15, John, Smith, Jane, and Coco registered in the address book may be classified into cluster A, cluster B, and cluster C. As described above in FIG. 10, this classification may be performed based on the similarity of the attributes associated with the person information for each frequency band.

The processor may personalize the call sound quality differently for each far-end based on information representing clusters (e.g. A, B, C), person information (e.g. John, Smith, Jane, Coco), terminal information (e.g. LG V50S ThinQ, Galaxy S10, iPhone 10, Xiaomi Redmi Note 5), and voice characteristics (e.g. low voice level, high voice level, volume, etc.). For reference, in FIG. 15, the low voice level and high voice level exemplify that the higher the level coefficient, the stronger the lower frequency or the stronger the higher frequency, and the present disclosure is not limited to the example of FIG. 15. In addition, the volume of the sound is not simply classified into a high sound or a low sound, and may be calculated as a discrete or continuous value like a frequency level.

The above-described present disclosure can be implemented as a computer-readable code on a medium on which a program is recorded. The computer readable medium includes all kinds of recording devices in which data that can be read by a computer system is stored. Examples of the computer readable medium may include a hard disk drive (HDD), a solid state disk (SSD), a silicon disk drive (SDD), a ROM, a RAM, a CD-ROM, a magnetic tape, a floppy disk, an optical data storage device, and the like, or be implemented in the form of a carrier wave (e.g., transmission over the internet). Accordingly, the above detailed description should not be construed in all aspects as limiting, and be considered illustrative. The scope of the present disclosure should be determined by rational interpretation of the appended claims, and all changes within the equivalent range of the present disclosure are included in the scope of the present disclosure.

What is claimed is:

1. A sound control method based on artificial intelligence, comprising:
obtaining a sound signal and mobile terminal information while performing a wireless call with a mobile terminal;
generating at least one set of person information for a user of the mobile terminal comprising at least identification information for the mobile terminal and voice information based on an attribute of a sound signal, wherein the voice information is mapped to the at least one set of person information stored in a memory; and
adjusting a parameter of an audio equalizer based on the generated at least one set of person information and a feature vector of the sound signal using a machine learning model, wherein the adjusted parameter of the audio equalizer is mapped to the generated at least one set of person information and stored in the memory.

2. The sound control method of claim 1, further comprising:
storing the obtained sound signal in a memory, wherein the sound signal includes comprises a voice signal obtained through a microphone of the mobile terminal, and
based on receiving a call signal from a particular mobile terminal corresponding to a specific user associated with the generated at least one set of person information stored in the memory, controlling a call sound quality output through a speaker based on loading the adjusted parameter of the audio equalizer associated with a set of person information for the specific user from the memory.

3. The sound control method of claim 1, wherein the attribute comprises a volume for each of a plurality of frequency bands.

4. The sound control method of claim 3, wherein the generating the set of person information further comprises:
determining a similarity by comparing attributes of two or more persons for each frequency band; and
classifying the two or more person information based on the determined similarity, wherein the set of person information comprises at least
the classified two or more person information.

5. The sound control method of claim 3, wherein the plurality of frequency comprises first to Nth bands, wherein N corresponds to a natural number, and
a frequency bandwidth of Kth band is an integer multiple of a frequency bandwidth of K-1th band, wherein K corresponds to a natural number that is less than N and greater than or equal to 2.

6. The sound control method of claim 1, further comprising based on the parameter of the audio equalizer changing from a first state to a second state, performing reinforcement learning that adjusts a parameter of the machine learning model based on a difference between the first and second states.

7. The sound control method of claim 1, wherein a parameter of the machine learning model is adjusted in response to receiving feedback on a result of adjusting the parameter of the audio equalizer.

8. The sound control method of claim 7, wherein the feedback is an input for adjusting the parameter of the audio equalizer through a user interface.

9. The sound control method of claim 1, wherein the person information comprises at least one of a name, the mobile terminal information, age, sex, or an occupation of the user.

10. The sound control method of claim 1, wherein the parameters comprise at least a frequency, a gain, or a Q-factor.

11. An intelligent mobile terminal, comprising:
a transceiver configured to obtain a sound signal and mobile terminal information while performing a wireless call with another mobile terminal connected to communicate through a network;
a memory in which at least one person information is recorded; and
a processor configured to:
generate at least one set of person information for a user of the intelligent mobile terminal comprising at least identification information for the intelligent mobile terminal and voice information based on an attribute of the sound signal, wherein the voice information is mapped to the at least one set of person information stored in the memory; and
adjust a parameter of an audio equalizer based on the generated at least one set of person information and a feature vector of the sound signal using a machine learning model, wherein the adjusted parameter of the audio equalizer is mapped to the generated at least one set of person information and stored in memory.

12. The intelligent mobile terminal of claim 11, wherein the processor is further configured to: based on receiving a call signal from a particular mobile terminal corresponding to a specific user associated with the generated at least on set of person information stored in the memory, controlling a call sound quality output through a speaker based on loading the adjusted parameter of the audio equalizer associated with a set of person information for the specific user from the memory.

13. The intelligent mobile terminal of claim 11, wherein the attribute comprises a volume for each of a plurality of frequency bands.

14. The intelligent mobile terminal of claim 13, wherein the processor is further configured to: determine a similarity by comparing attributes of two or more persons for each frequency band, classify the two or more person information based on the determined similarity, wherein the set of person information comprises at least, the classified two or more person information.

15. The intelligent mobile terminal of claim 11, wherein the processor is further configured to: based on the parameter of the audio equalizer changing from a first state to a second state, perform reinforcement learning that adjusts a parameter of the machine learning model based on a difference between the first and second states.

16. The intelligent mobile terminal of claim 11, wherein the processor is further configured to: adjust a parameter of the machine learning model in response to receiving feedback on a result of adjusting the parameter of the audio equalizer.

17. The intelligent mobile terminal of claim 16, wherein the feedback is an input for adjusting the parameter of the audio equalizer through a user interface.

18. The intelligent mobile terminal of claim 11, wherein the person information comprises at least one of a name, the mobile terminal information, age, sex, or an occupancy of the user.

19. The intelligent mobile terminal of claim 18, wherein the parameters comprise at least a frequency, a gain, or a Q-factor.

20. A non-statutory computer-readable recording medium on which a program for executing a method of:
obtaining a sound signal and mobile terminal information while performing a wireless call with a mobile terminal;
generating at least one set of person information for a user of the mobile terminal comprising at least identification information for the mobile terminal and voice information based on an attribute of a sound signal, wherein the voice information is mapped to the at least one set of person information stored in a memory; and
adjusting a parameter of an audio equalizer based on the generated at least one set of person information and a feature vector of the sound signal using a machine learning model, wherein the adjusted parameter of the audio equalizer is mapped to the generated at least one set of person information and stored in the memory.

* * * * *